US012581691B2

(12) United States Patent
Chen et al.

(10) Patent No.: US 12,581,691 B2
(45) Date of Patent: Mar. 17, 2026

(54) METHODS OF MANUFACTURING SEMICONDUCTOR DEVICES AND SEMICONDUCTOR DEVICES

(71) Applicant: TAIWAN SEMICONDUCTOR MANUFACTURING COMPANY, LTD., Hsinchu (TW)

(72) Inventors: Ting-Yeh Chen, Hsinchu City (TW); Wei-Yang Lee, Taipei City (TW); Chia-Pin Lin, Xinpu Township (TW); Chih-Ching Wang, Jinhu Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 767 days.

(21) Appl. No.: 17/864,104

(22) Filed: Jul. 13, 2022

(65) Prior Publication Data

US 2023/0378300 A1      Nov. 23, 2023

Related U.S. Application Data

(60) Provisional application No. 63/342,795, filed on May 17, 2022.

(51) Int. Cl.
H10D 30/67          (2025.01)
H01L 21/311         (2006.01)
(Continued)

(52) U.S. Cl.
CPC .... H10D 30/6735 (2025.01); H01L 21/31111 (2013.01); H10D 30/6757 (2025.01);
(Continued)

(58) Field of Classification Search
CPC ........... H10D 30/6735; H10D 30/6757; H10D 62/121; H10D 64/015; H10D 64/017;
(Continued)

(56) References Cited

U.S. PATENT DOCUMENTS 11,107,836 B2      8/2021   Lin et al.
11,121,037 B2 *    9/2021   Tsai ................... H10D 84/0172
(Continued)

FOREIGN PATENT DOCUMENTS

TW          202113938 A      4/2021
TW          202113987 A      4/2021
(Continued)

*Primary Examiner* — Shahed Ahmed
(74) *Attorney, Agent, or Firm* — STUDEBAKER BRACKETT PLLC

(57)          ABSTRACT

In a method of manufacturing a semiconductor device, a fin structure, in which first and second semiconductor layers are alternately stacked over a substrate, is formed, a source/drain region of the fin structure is etched thereby forming a source/drain space, ends of the first semiconductor layers are laterally etched in the source/drain space, a first insulating layer is formed on a sidewall of the source/drain space, the first insulating layer is partially etched, thereby forming a first bottom spacer at a bottom of the source/drain space, a second insulating layer is formed on the sidewall of the source/drain space, the second insulating layer is partially etched, thereby forming inner spacers on end faces of the first semiconductor layers and leaving a part of the second insulating layer as a second bottom spacer at the bottom of the source/drain space, and a source/drain epitaxial layer is formed in the source/drain space.

20 Claims, 21 Drawing Sheets

(51) Int. Cl.
*H10D 62/10* (2025.01)
*H10D 64/01* (2025.01)
*H10D 64/23* (2025.01)

(52) U.S. Cl.
CPC ......... *H10D 62/121* (2025.01); *H10D 64/015* (2025.01); *H10D 64/017* (2025.01); *H10D 64/018* (2025.01); *H10D 64/258* (2025.01)

(58) Field of Classification Search
CPC .............. H10D 30/797; H10D 64/021; H10D 30/501–509; H10D 30/43–435; H10D 62/119–123; H10D 64/675–679; H10D 64/68–693; H01L 21/31111; B82Y 10/00
See application file for complete search history.

(56) References Cited

U.S. PATENT DOCUMENTS

| | | | |
|---|---|---|---|
| 11,450,754 B2 | 9/2022 | Lin et al. | |
| 2021/0119031 A1 | 4/2021 | Song et al. | |
| 2022/0122893 A1 | 4/2022 | Lai et al. | |
| 2023/0187509 A1* | 6/2023 | Alaan | H01L 21/0259 |
| | | | 257/351 |
| 2023/0282717 A1* | 9/2023 | Guler | H10D 62/121 |
| | | | 257/288 |

FOREIGN PATENT DOCUMENTS

| | | | |
|---|---|---|---|
| TW | 202117855 A | 5/2021 | |
| TW | 202217980 A | 5/2022 | |

* cited by examiner

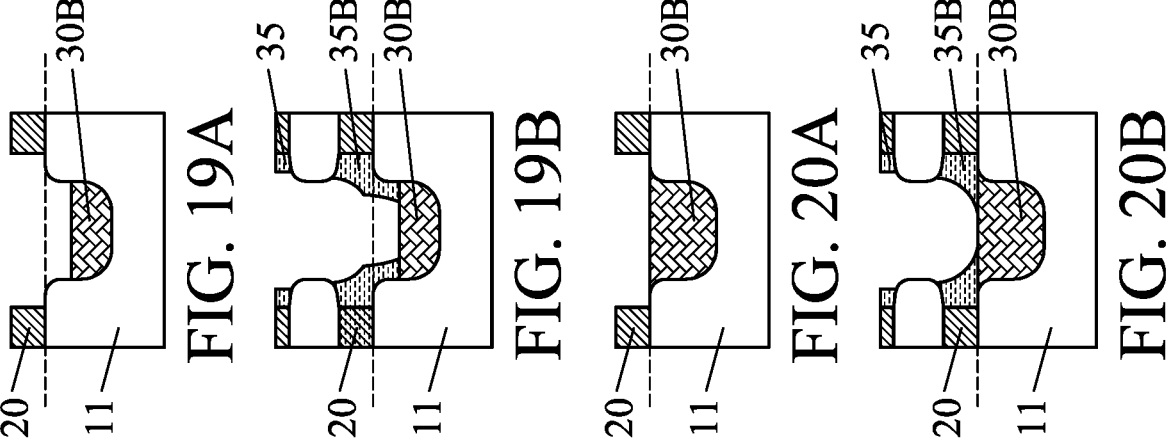
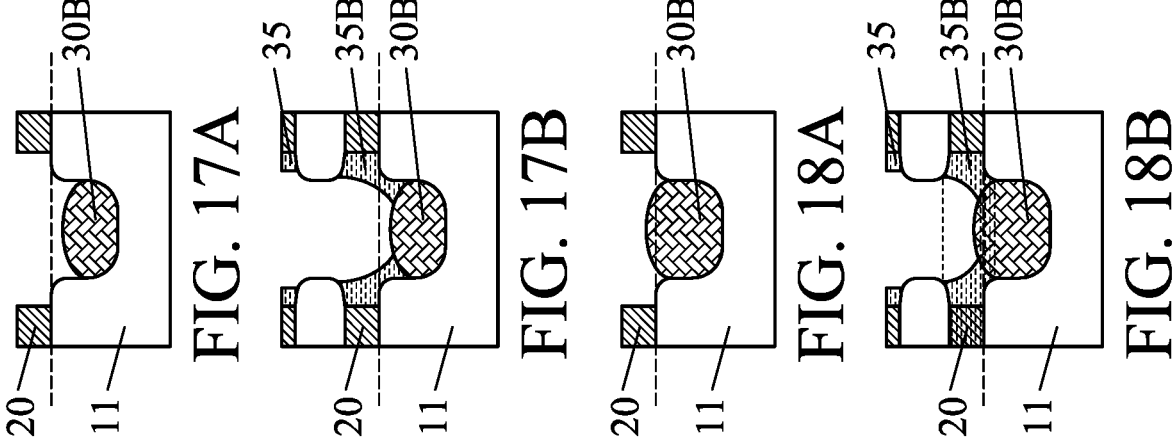

METHODS OF MANUFACTURING SEMICONDUCTOR DEVICES AND SEMICONDUCTOR DEVICES

RELATED APPLICATION

This application claims priority to U.S. Provisional Patent Application No. 63/342,795 filed May 17, 2022, the entire contents of which are incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multigate field effect transistor (FET), including a finFET (Fin-FET) using a fin structure as a channel region and a gate-all-around (GAA) FET using multiple nano sheets or nano wires as a channel region.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 17A and 17B show views of the various stages of a sequential manufacturing process of a semiconductor GAA FET device according to an embodiment of the present disclosure.

FIGS. 18A and 18B show views of the various stages of a sequential manufacturing process of a semiconductor GAA FET device according to an embodiment of the present disclosure.

FIGS. 19A and 19B show views of the various stages of a sequential manufacturing process of a semiconductor GAA FET device according to an embodiment of the present disclosure.

FIGS. 20A and 20B show views of the various stages of a sequential manufacturing process of a semiconductor GAA FET device according to an embodiment of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described. In the present disclosure, a source and a drain are interchangeably used and may be referred to as a source/drain. Source/drain region(s) may refer to a source or a drain, individually or collectively dependent upon the context.

Suppressing a leakage current (off-current) of a semiconductor FET device is one of the key issues in advanced semiconductor devices. In the present disclosure, a semiconductor device including GAA FETs having an advanced isolation structure below a source/drain epitaxial layer and the manufacturing method thereof are described.

FIGS. 1 to 15 show various stages of a sequential manufacturing operation of semiconductor FET devices. It is understood that additional operations can be provided before, during, and after processes shown by FIGS. 1 to 15, and some of the operations described below can be replaced or eliminated, for additional embodiments of the method. The order of the operations/processes may be interchangeable.

Figure 1:
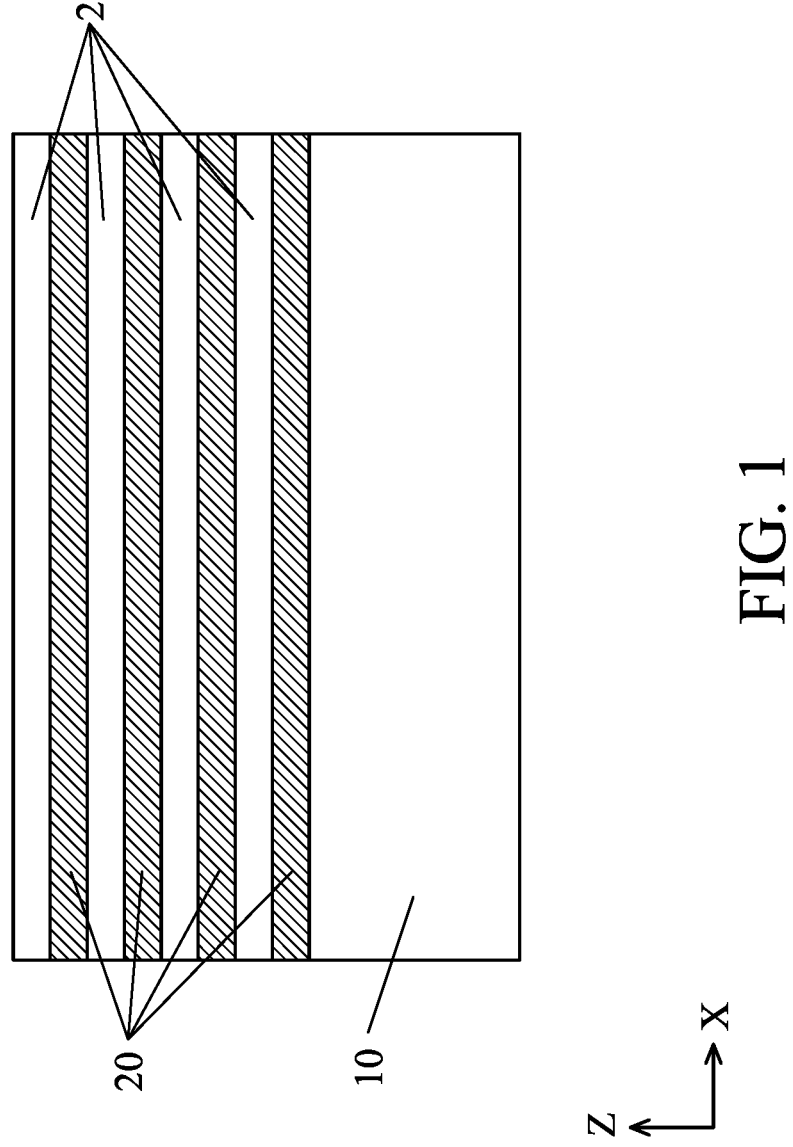
FIG. 1 shows one of the various stages of a sequential manufacturing process of a semiconductor GAA FET device according to an embodiment of the present disclosure.

As shown in FIG. 1, first semiconductor layers 20 and second semiconductor layers 25 are alternately formed over the substrate 10. In some embodiments, the substrate 10 includes a single crystalline semiconductor layer on at least its surface portion. The substrate 10 may include a single crystalline semiconductor material such as, but not limited to Si, Ge, SiGe, GaAs, InSb, GaP, GaSb, InAlAs, InGaAs, GaSbP, GaAsSb and InP. In certain embodiments, the substrate 10 is made of crystalline Si.

The substrate 10 may include in its surface region, one or more buffer layers (not shown). The buffer layers can serve to gradually change the lattice constant from that of the substrate to that of the source/drain region. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 includes silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer.

The first semiconductor layers 20 and the second semiconductor layers 25 are made of materials having different lattice constants, and may include one or more layers of Si, Ge, SiGe, GaAs, InSb, GaP, GaSb, InAlAs, InGaAs, GaSbP, GaAsSb or InP.

In some embodiments, the first semiconductor layers 20 and the second semiconductor layers 25 are made of Si, a Si compound, SiGe, Ge or a Ge compound. In some embodiments, the first semiconductor layers 20 are $Si_{1-x}Ge_x$, where x is equal to or more than about 0.1 and equal to or less than about 0.6, and the second semiconductor layers 25 are Si or $Si_{1-y}Ge_y$, where y is smaller than x and equal to or less than about 0.2. In this disclosure, an "M" compound" or an "M based compound" means the majority of the compound is M.

In other embodiments, the second semiconductor layers 25 are $Si_{1-y}Ge_x$, where x is equal to or more than about 0.1 and equal to or less than about 0.6, and the first semiconductor layers 20 are Si or $Si_{1-y}Ge_y$, where y is smaller than x and equal to or less than about 0.2.

The first semiconductor layers 20 and the second semiconductor layers 25 are epitaxially formed over the substrate 10. The thickness of the first semiconductor layers 20 may be equal to or greater than that of the second semiconductor layers 25, and is in a range from about 5 nm to about 60 nm in some embodiments, and is in a range from about 10 nm to about 30 nm in other embodiments. The thickness of the second semiconductor layers 25 is in a range from about 5 nm to about 60 nm in some embodiments, and is in a range from about 10 nm to about 30 nm in other embodiments. The thickness of the first semiconductor layers 20 may be the same as, or different than the thickness of the second semiconductor layers 25. Although four first semiconductor layers 20 and four second semiconductor layers 25 are shown in FIG. 1, the numbers are not limited to four, and can be 1, 2, 3 or more than 4, and is less than 20. In some embodiments, the number of the first semiconductor layers 20 is greater, by one, from the number of the second semiconductor layers 25 (i.e.—the top layer is the first semiconductor layer 20).

Figure 2:
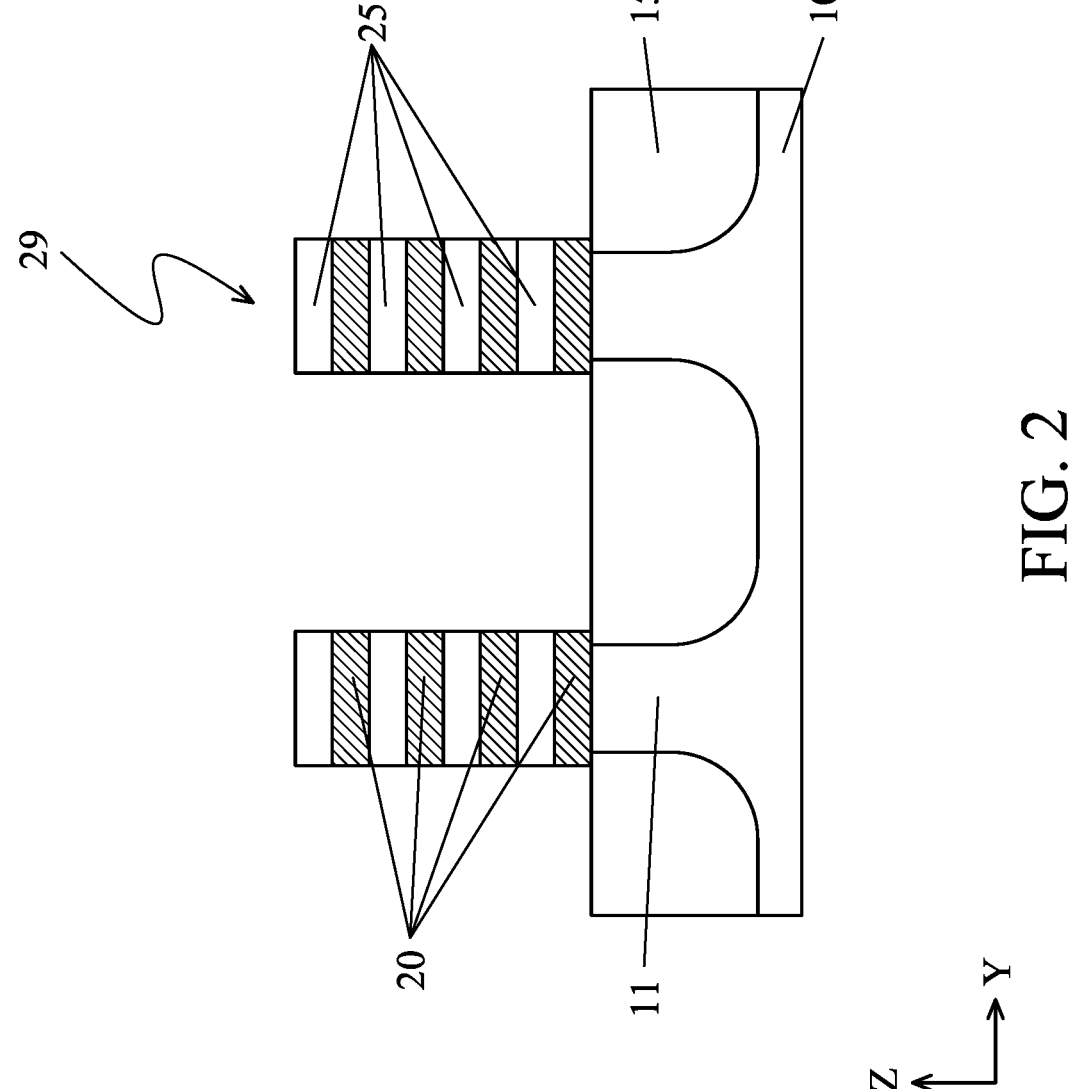
FIG. 2 shows one of the various stages of a sequential manufacturing process of a semiconductor GAA FET device according to an embodiment of the present disclosure.

After the stacked semiconductor layers are formed, fin structures 29 are formed by using one or more lithography and etching operations, as shown in FIG. 2. The fin structures may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

As shown in FIG. 2, the fin structures 29 extend in the X direction and are arranged in the Y direction. The number of the fin structures is not limited to two as shown in FIG. 2, and may be as small as one and three or more. In some embodiments, one or more dummy fin structures are formed on both sides of the fin structures 29 to improve pattern fidelity in the patterning operations. As shown in FIG. 2, the fin structures 29 have upper portions constituted by the stacked first and second semiconductor layers 20, 25 over the base portion 11 (bottom fin structure) of the fin structures 29.

The width of the upper portion of the fin structure 29 along the Y direction is in a range from about 8 nm to about 100 nm in some embodiments, and is in a range from about 15 nm to about 30 nm in other embodiments.

After the fin structures 29 are formed, an insulating material layer including one or more layers of an insulating material is formed over the substrate so that the fin structures are fully embedded in the insulating layer. The insulating material for the insulating layer may include silicon oxide, silicon nitride, silicon oxynitride (SiON), SiOCN, SiCN, fluorine-doped silicate glass (FSG), or a low-k dielectric material, formed by LPCVD (low pressure chemical vapor deposition), plasma-enhanced CVD (PECVD) or flowable CVD. An anneal operation may be performed after the formation of the insulating layer. Then, a planarization operation, such as a chemical mechanical polishing (CMP) method and/or an etch-back method, is performed such that the upper surface of the uppermost second semiconductor layer 25 is exposed from the insulating material layer. In some embodiments, one or more fin liner layers are formed over the fin structures before forming the insulating material layer. In some embodiments, the fin liner layers include a first fin liner layer formed over the substrate 10 and sidewalls of the base portion 11 of the fin structures 29, and a second fin liner layer formed on the first fin liner layer. The fin liner layers are made of silicon nitride or a silicon nitride-based material (e.g., SiON, SiCN or SiOCN). The fin liner layers may be deposited through one or more processes such as physical vapor deposition (PVD), chemical vapor deposition (CVD), or atomic layer deposition (ALD), although any acceptable process may be utilized.

Then, as shown in FIG. 2, the insulating material layer is recessed to form an isolation insulating layer 15 so that the upper portions of the fin structures 29 are exposed. With this operation, the fin structures 29 are separated from each other by the isolation insulating layer 15, which is also called a shallow trench isolation (STI). The isolation insulating layer 15 may be made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the isolation insulating layer 15 is formed through a process such as CVD, flowable CVD (FCVD), or a spin-on-glass process, although any acceptable process may be utilized.

In some embodiments, the isolation insulating layer 15 is recessed until the upper portion of the fin structure 29 over the base portion 11 is exposed. In other embodiments, the upper portion of the fin structure 29 is not exposed. The first semiconductor layers 20 are sacrificial layers which are subsequently partially removed, and the second semiconductor layers 25 are subsequently formed into semiconductor wires as channel regions of the GAA FET. In other embodiments, the second semiconductor layers 25 are sacrificial layers which are subsequently partially removed, and the first semiconductor layers 20 are subsequently formed into semiconductor wires as channel regions.

Figures 3A, 3B:
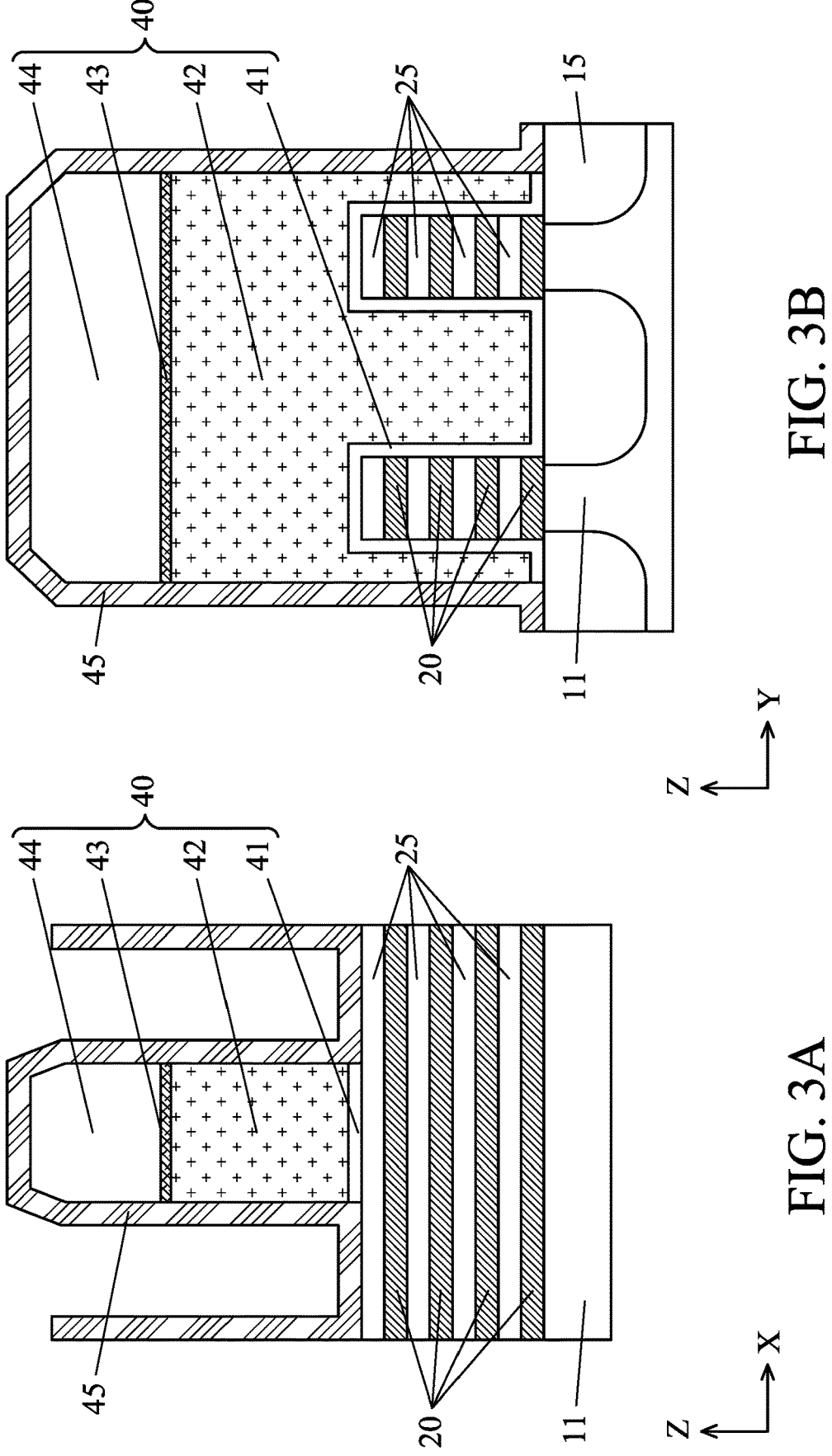
FIGS. 3A and 3B show one of the various stages of a sequential manufacturing process of a semiconductor GAA FET device according to an embodiment of the present disclosure.

After the isolation insulating layer 15 is formed, a sacrificial (dummy) gate structure 40 is formed, as shown in FIGS. 3A and 3B. FIGS. 3A and 3B illustrate a structure after a sacrificial gate structure 40 is formed over the exposed fin structures 29. The sacrificial gate structure 40 is formed over a portion of the fin structures which is to be a channel region. The sacrificial gate structure 40 defines the channel region (channel length) of the GAA FET. The sacrificial gate structure 40 includes a sacrificial gate dielectric layer 41 and a sacrificial gate electrode layer 42. The sacrificial gate dielectric layer 41 includes one or more layers of insulating material, such as a silicon oxide-based material. In one embodiment, silicon oxide formed by CVD is used. The thickness of the sacrificial gate dielectric layer 41 is in a range from about 1 nm to about 5 nm in some embodiments.

The sacrificial gate structure 40 is formed by first blanket depositing the sacrificial gate dielectric layer 41 over the fin structures. A sacrificial gate electrode layer 42 is then blanket deposited on the sacrificial gate dielectric layer and over the fin structures, such that the fin structures are fully embedded in the sacrificial gate electrode layer. The sacrificial gate electrode layer includes silicon, such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer is formed over the sacrificial gate electrode layer. The mask layer includes a pad silicon nitride layer 43 and a silicon oxide mask layer 44.

Next, a patterning operation is performed and the mask layer and the sacrificial gate electrode layer are patterned into the sacrificial gate structure 40, as shown in FIGS. 3A and 3B. The sacrificial gate structure includes the sacrificial gate dielectric layer 41, the sacrificial gate electrode layer 42 (e.g., poly silicon), the pad silicon nitride layer 43 and the silicon oxide mask layer 44. By patterning the sacrificial gate structure, the stacked layers of the first and second semiconductor layers 20 and 25 are partially exposed on opposite sides of the sacrificial gate structure, thereby defining a source/drain region, as shown in FIG. 3A. In FIGS. 3A and 3B, one sacrificial gate structure is formed over two fin structures, but the number of the sacrificial gate structures is not limited to one. Two or more sacrificial gate structures are arranged in the X direction in some embodiments. In certain embodiments, one or more dummy sacrificial gate structures are formed on both sides of the sacrificial gate structures to improve pattern fidelity.

Further, a first cover layer 45 for the gate sidewall spacers is formed over the sacrificial gate structure 40, as shown in FIGS. 3A and 3B. The cover layer 45 is deposited in a conformal manner so that it has substantially equal thicknesses on vertical surfaces, such as the sidewalls, horizontal surfaces, and the top of the sacrificial gate structure, respectively. In some embodiments, the first cover layer 45 includes a first layer 45A and a second layer 45B formed over the first layer 45A and made of a different material than the first layer 45A. In some embodiments, each of the first and second layers has a thickness in a range from about 2 nm to about 20 nm. In some embodiments, the second layer 45B is thinner than the first layer 45A. The first and second layers include one or more of silicon oxide, silicon nitride, SiON, SiCN, SiOSC, SiOCN or any other suitable dielectric material. The cover layers 45 (sidewall spacers) can be formed by ALD or CVD, or any other suitable method.

In FIGS. 4A-4C through 10A-10C, the "A" figures show perspective views, the "B" figures show cross sectional views along the Y direction and the "C" figures show cross sectional views along the X direction between two sacrificial gate structures.

Figures 4A, 4B, 4C:
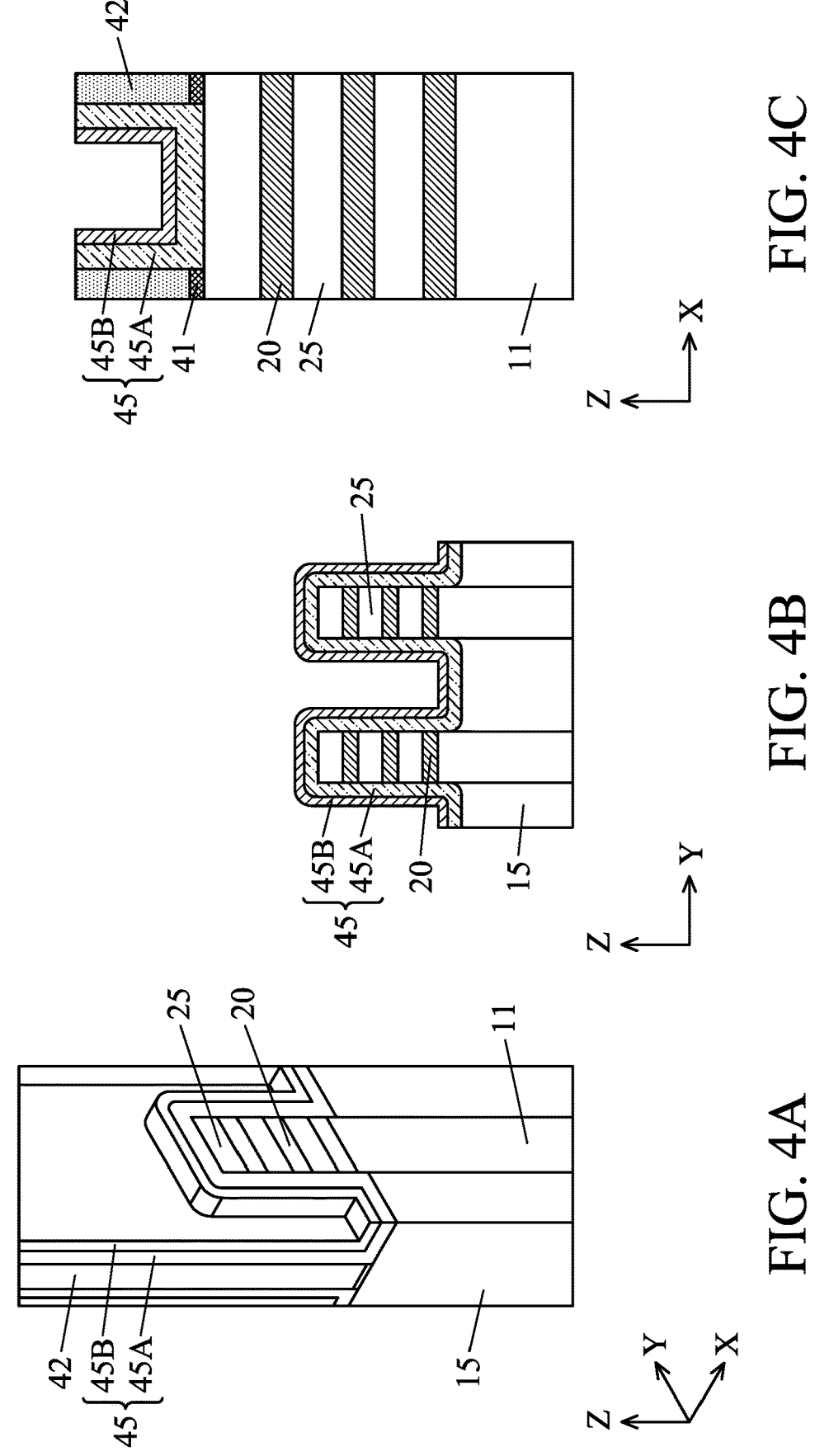
FIGS. 4A, 4B and 4C show one of the various stages of a sequential manufacturing process of a semiconductor GAA FET device according to an embodiment of the present disclosure.

FIGS. 4A-4C show the structure corresponding to FIGS. 3A and 3B, after the first cover layer 45 is formed. Then, the first cover layer 45 is anisotropicaly etched to remove the horizontal portion of the first cover layer 45 disposed on the source/drain region and the top of the sacrificial gate structure, while leaving the first cover layer as sidewall spacers 45 on side faces of the sacrificial gate structure 40 and the fin structures 29.

Figures 5A, 5B, 5C:
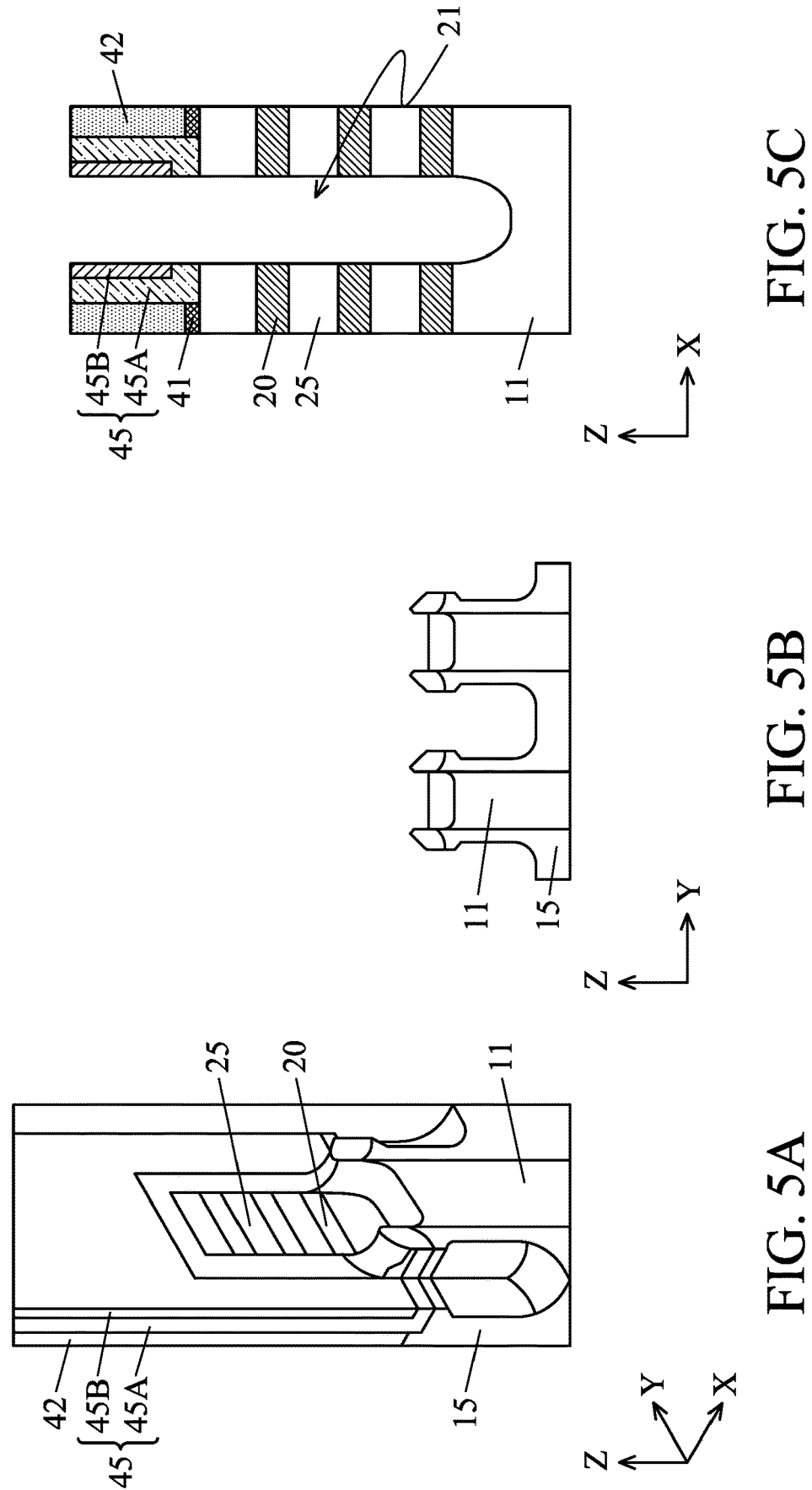
FIGS. 5A, 5B and 5C show one of the various stages of a sequential manufacturing process of a semiconductor GAA FET device according to an embodiment of the present disclosure.

Then, as shown in FIGS. 5A-5C, the stacked structure of the first semiconductor layers 20 and the second semiconductor layer 25 is etched down at the source/drain region (e.g., between two sacrificial gate structures), by using one or more lithography and etching operations, thereby forming a recessed source/drain space 21. In some embodiments, the substrate 10 (or the base portion 11 of the fin structure) is also partially etched. In some embodiments, an n-type FET and a p-type FET are manufactured separately, and in such a case, a region for one type of FET is processed, and a region for the other type of FET is covered by a protective layer, such as a silicon nitride layer. In some embodiments, as shown in FIGS. 5A-5C, the recessed space 21 has a U-shape. In other embodiments, the recessed space 21 has a V-shape showing (111) facets of silicon crystal. In other embodiments, the recessed space 21 has a reverse trapezoid shape, or a rectangular shape.

In some embodiments, the recessed source/drain space 21 is formed by a dry etching process, which may be anisotropic. The anisotropic etching process may be performed using a process gas mixture including $BF_2$, $Cl_2$, $CH_3F$, $CH_4$, HBr, $O_2$, Ar, or other etchant gases. The plasma is a remote plasma that is generated in a separate plasma generation chamber connected to the processing chamber. Process gases may be activated into plasma by any suitable method of generating the plasma, such as transformer coupled plasma (TCP) systems, inductively coupled plasma (ICP) systems, and magnetically enhanced reactive ion techniques. The process gases used in the plasma etching process include etchant gases such as $H_2$, Ar, other gases, or a combination of gases. In some embodiments, carrier gases, such as $N_2$, Ar, He, or Xe are used in a plasma etching process using hydrogen (H) radicals. The H radicals may be formed by flowing $H_2$ gas into a plasma generation chamber and igniting a plasma within the plasma generation chamber. In some embodiments, an additional gas may be ignited into a plasma within the plasma generation chamber, such as Ar. The H radicals may selectively etch (100) planes over (111) planes or (110) planes. In some cases, the etch rate of (100) planes may be about three times greater than the etch rate of (111) planes. Due to this selectivity, the etching by the H radicals may tend to slow or stop along (111) planes or (110) planes of silicon during the etching process.

In some embodiments, the isolation insulating layer 15 is also recessed as shown in FIGS. 5A and 5B. The recessed amount is in a range from about 5 nm to about 40 nm in some embodiment, depending on the design and/or process requirements. In some embodiments, the bottom of the source/drain space 21 is located below the uppermost surface of the isolation insulating layer 15.

In some embodiments, during the recess etching of the source/drain region, the sidewall spacers 45 formed on the sides of the source/drain region of the fin structure, which may be referred to as fin spacers, are also recessed (etched). In some embodiments, the top surface of the recessed fin spacer is substantially level with or higher than the bottom surface of the bottommost one of the first semiconductor layers 20 and lower than the top surface of the bottommost one of the second semiconductor layers 25. In some embodiments, the height difference between the top surface of the recessed fin spacer 45 and the bottom surface of the bottommost one of the first semiconductor layers 20 is smaller than about 10 nm.

Figures 6A, 6B, 6C:
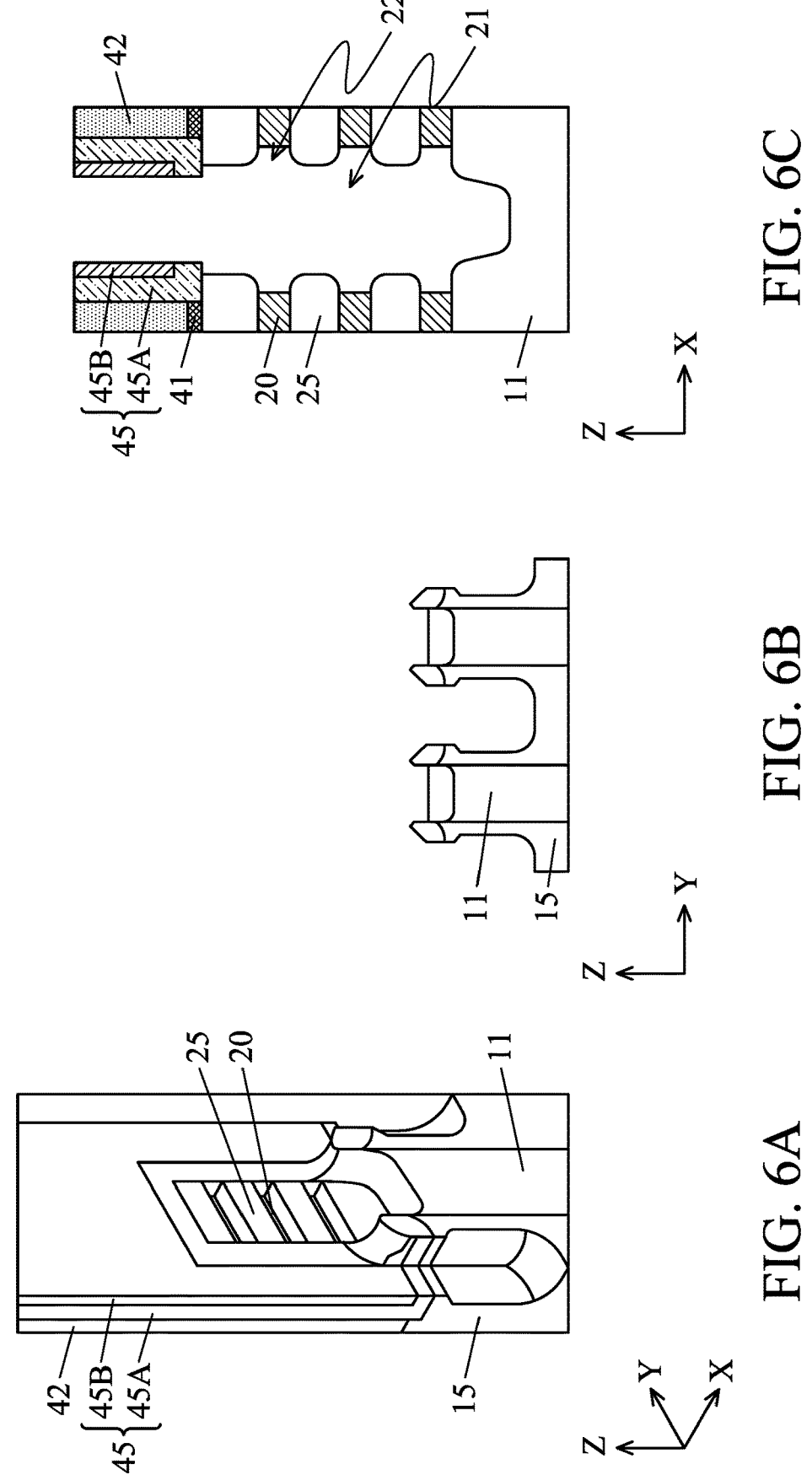
FIGS. 6A, 6B and 6C show one of the various stages of a sequential manufacturing process of a semiconductor GAA FET device according to an embodiment of the present disclosure.

Further, as shown in FIGS. 6A-6C, the first semiconductor layers 20 are laterally etched in the X direction within the source/drain space 21, thereby forming cavities, notches or lateral recesses 22. When the first semiconductor layers 20 are SiGe and the second semiconductor layers 25 are Si, the first semiconductor layers 20 can be selectively etched by using a wet etchant such as, but not limited to, a mixed solution of $H_2O_2$, $CH_3COOH$ and HF, followed by $H_2O$ cleaning. In some embodiments, the etching by the mixed solution and cleaning by water is repeated 10 to 20 times. The etching time by the mixed solution is in a range from about 1 min to about 2 min in some embodiments. The mixed solution is used at a temperature in a range from about 60° C. to about 90° C. in some embodiments. In some embodiments, other etchants are used.

In some embodiments, the laterally recessed amount of the first semiconductor layers 20 is in a range from about 4 nm to about 9 nm. In some embodiments, the ends of the second semiconductor layers 25 are also slightly etched in an amount of about 5 nm or less. During the lateral etching of the first semiconductor layer 20, the isolation insulating layer 15 is also slightly recessed or etched. In some embodiments, the recess amount of the isolation insulating layer 15 is less than about 3 nm. In some embodiments, the portion of the isolation insulating layer 115 vertically under the fin spacers 45 are also partially recessed. In some embodiments, a portion of the isolation insulating layer 15 formed on the sidewall of the bottom fin structure 11 is narrower than the fin spacers 45.

Figures 7A, 7B, 7C:
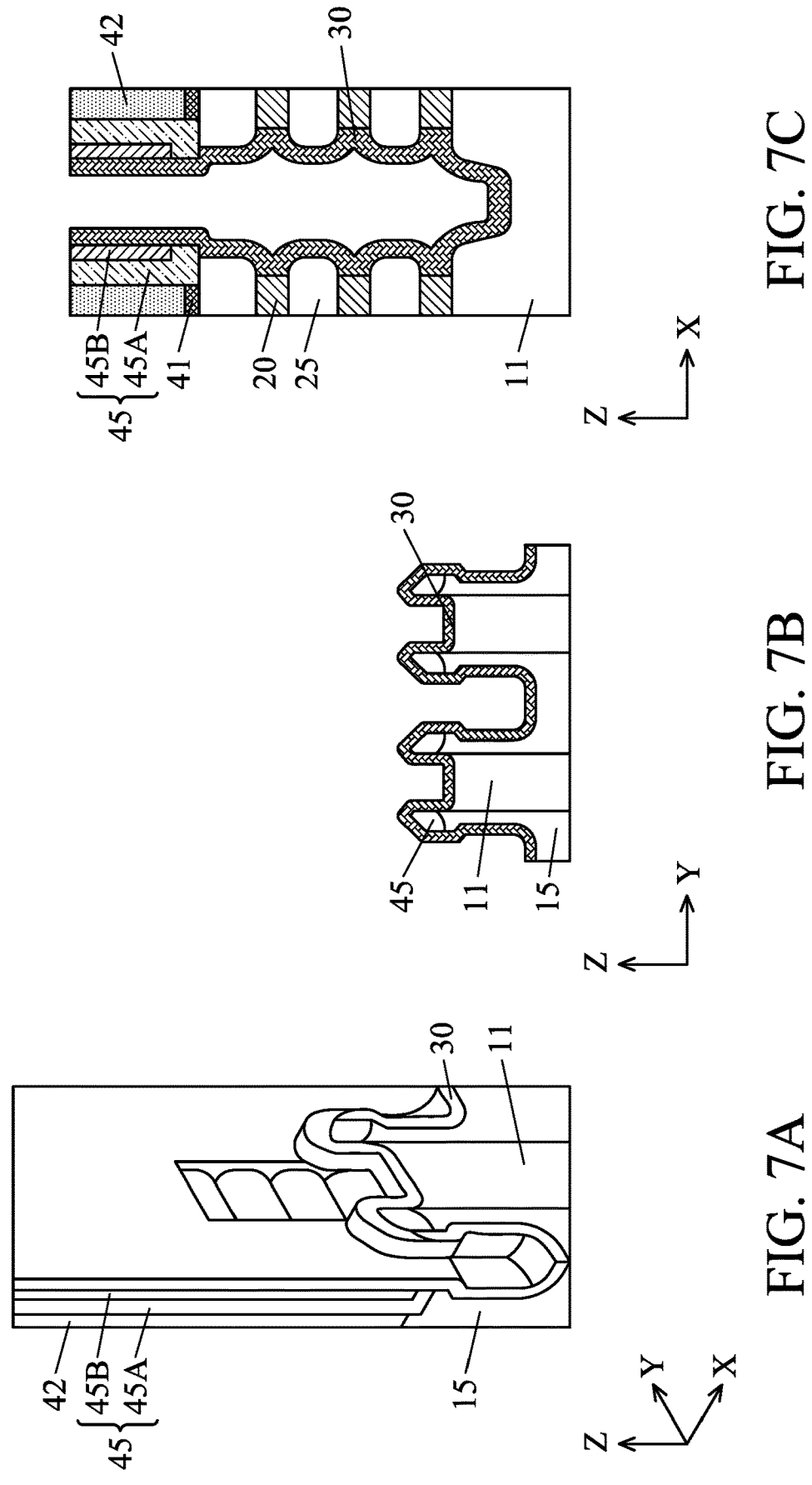
FIGS. 7A, 7B and 7C show one of the various stages of a sequential manufacturing process of a semiconductor GAA FET device according to an embodiment of the present disclosure.

Next, as shown in FIGS. 7A-7C, a first insulating layer 30 is conformally formed in the source/drain space 21. The first insulating layer 30 is formed on the etched lateral ends of the first semiconductor layers 20, e.g., the cavities, and on end faces of the second semiconductor layers 25 in the source/drain space 21 and is formed over the sacrificial gate structure 40. The first insulating layer 30 includes one of silicon nitride and silicon oxide, SiON, SiOC, SiCN and SiOCN, or any other suitable dielectric material. The first insulating layer 30 is made of a different material than the sidewall spacers 45 (first cover layer). In certain embodiments, the first insulating layer 30 is made of SiOCN. In some embodiments, the first insulating layer 30 includes SiOCN formed by a topography selectivity method. The material formed by the topography selectivity method has harder bottom portions and softer sidewall portions, so that the removal of the sidewall portions is easier than the bottom portions, in some embodiments. In some embodiments, the first insulating layer 30 is formed by performing a process under plasma power (e.g., input RF power) of about 20 W to about 100 W and a pressure of about 10 Torr to about 20 Torr. The plasma power used for forming the sidewall portions is less that that used for forming the bottom portion of the first insulating layer 30. In some embodiments, the high power makes a harder material, and the low power makes a softer or porous material. In some embodiments, during the film deposition process, one or more of the conditions (e.g., plasma power) is changed (e.g., high power to low power). In some embodiments, the first insulating layer is deposited under the high power condition to form a portion on the bottom of the source/drain space and then changed to the low power condition to form a portion on the sidewall of the source/drain space. In some embodiments, the first insulating layer 30 is made of $SiO_xC_yN_z$, where $0.1 \le x \le 0.4$, $0.05 \le y \le 0.1$ and $0.2 \le z \le 0.5$.

The first insulating layer 30 has a thickness in a range from about 1.0 nm to about 10.0 nm in some embodiments. In other embodiments, the first insulating layer 30 has a thickness in a range from about 2.0 nm to about 6.0 nm. When the thickness is too large, the remaining space of the source/drain space is too small, which may affect the formation of the source/drain epitaxial layer. When the thickness is too small, a substantial filling effect at the bottom of the source/drain space by the insulating layer may not be obtained.

By conformally forming the first insulating layer 30, the cavities of the first semiconductor layers 20 in the source/drain space 21 are fully filled with the first insulating layer 30. As shown, a bottom of the source/drain space 21 and the walls surrounding the source/drain space 21 are covered with the first insulating layer 30.

Figures 8A, 8B, 8C:
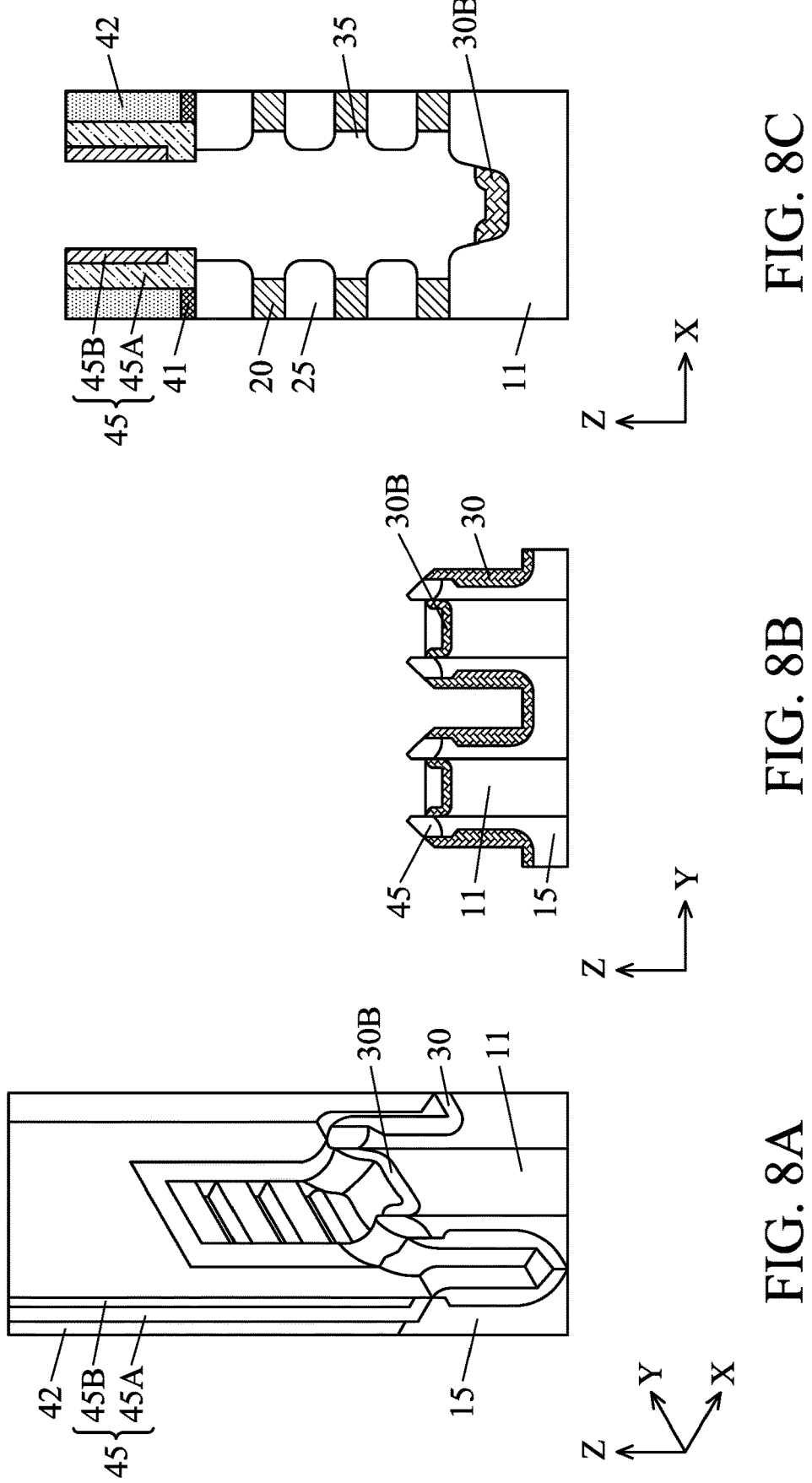
FIGS. 8A, 8B and 8C show one of the various stages of a sequential manufacturing process of a semiconductor GAA FET device according to an embodiment of the present disclosure.

Next, as shown in FIGS. 8A-8C, part of the first insulating layer 30 is removed by one or more etching operations to expose the side faces of the first and second semiconductor layers and to leave a bottom part 30B of the first insulating layer. In some embodiments, a wet etching using dilute HF (hydrofluoric acid) is used to partially remove the first insulating layer 30. In some embodiments, the HF etching is performed under: $HF:H_2O=1:100$ for about 5 sec to about 20 sec. Since the first insulating layer 30 is formed by a topography selectivity method, a softer portion formed on the sidewalls of the source/drain space 21 is more etched than a harder portion formed at the bottom of the source/drain space 21. In some embodiments, the remaining bottom portion 30B has a thickness in a range from about 2 nm to about 5 nm. When the thickness is too thin, it may be vulnerable to process variations, and when the thickness is too large, the source/drain epitaxial layer formation may be affected. In some embodiments, the first insulating layer 30 formed on the fin spacer and the isolation insulating layer is also partially removed by an amount of about 1-2 nm. The remaining portions of the first insulating layer 30 over the fin spacers are used as the protection layer of the fin structure.

Figures 9A, 9B, 9C:
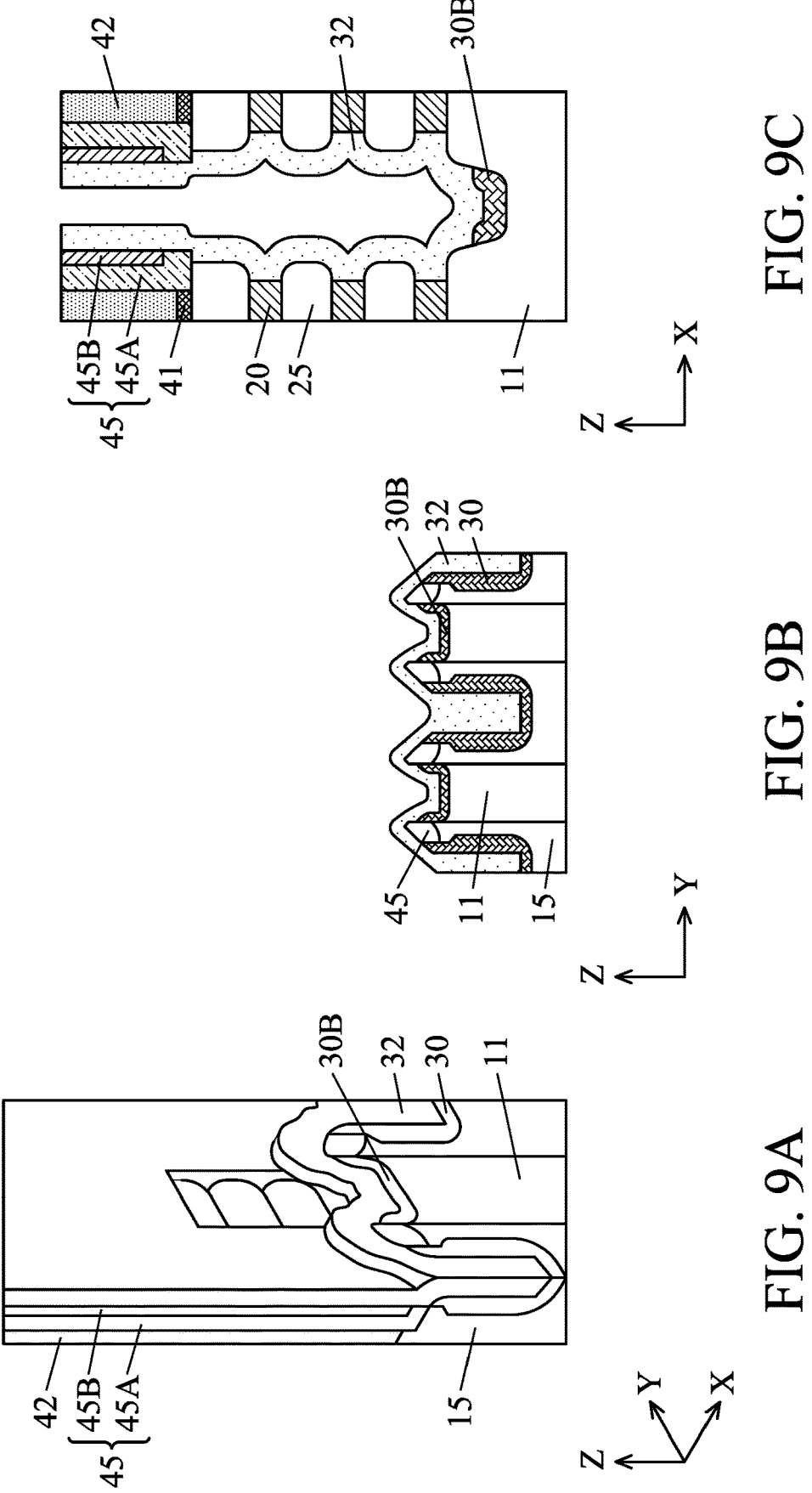
FIGS. 9A, 9B and 9C show one of the various stages of a sequential manufacturing process of a semiconductor GAA FET device according to an embodiment of the present disclosure.

Next, as shown in FIGS. 9A-9C, a second insulating layer 32 is conformally formed in the source/drain space 21. The second insulating layer 32 is formed on the exposed lateral ends of the first semiconductor layers 20 and on the exposed end faces of the second semiconductor layers 25 in the source/drain space 21 and is formed over the sacrificial gate structure 40.

The second insulating layer 32 is made of the same material as or a different material than the first insulating layer 30, and includes one of silicon nitride and silicon oxide, SiON, SiOC, SiCN and SiOCN, or any other suitable dielectric material. In certain embodiments, silicon nitride is used. The second insulating layer 32 is made of a different material than the sidewall spacers 45 in some embodiments.

The second insulating layer 32 has a thickness in a range from about 2.0 nm to about 15.0 nm in some embodiments. In other embodiments, the second insulating layer 32 has a thickness in a range from about 5.0 nm to about 10.0 nm.

Figures 10A, 10B, 10C:
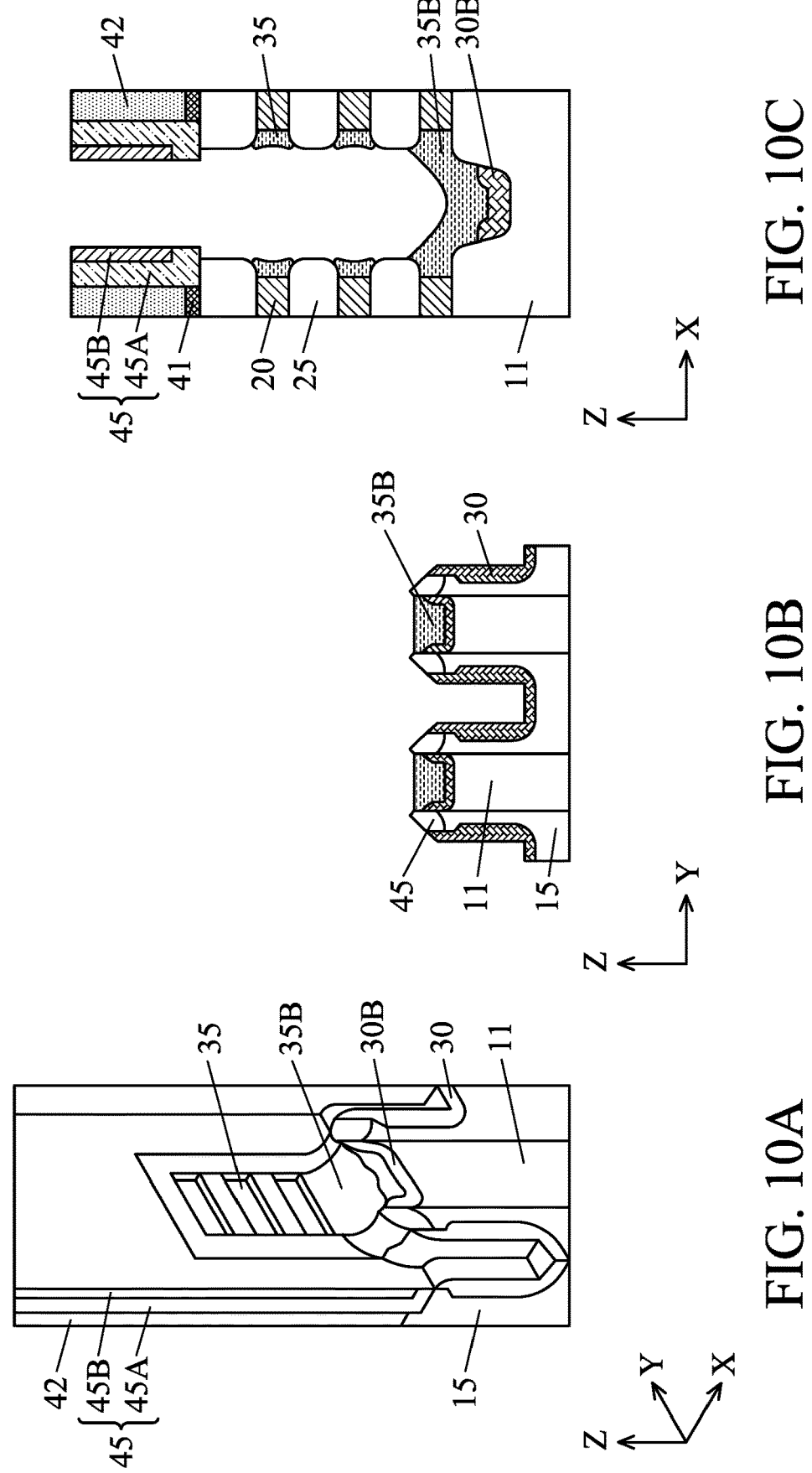
FIGS. 10A, 10B and 10C show one of the various stages of a sequential manufacturing process of a semiconductor GAA FET device according to an embodiment of the present disclosure.

Further, as shown in FIGS. 10A-10C, isotropic etching and/or anisotropic etching are performed to remove part of the second insulating layer 32, thereby forming inner spacers 35 on the end faces of the first semiconductor layers 20. In some embodiments, the second insulating layer 32 formed over the sacrificial gate structure 40 is fully removed. In some embodiments, a part of the second insulating layer 32 remains as a bottom spacer 35B as shown in FIGS. 10A-10C. The bottom spacer 35B suppress a junction leakage current.

In some embodiments, the etching operation on the second insulating layer is plasma etching performed under a bias power in a range from about 100 W to about 300 W. The power is changed during the etching such that the power used to etch the bottom portion is lower than that used to etch the sidewall portions. Since the bottom spacer 35B is formed at the bottom of the source/drain space, the height difference between the bottommost one of the first semiconductor layers 20 and the bottom of the source/drain space is reduced. Accordingly, after the inner spacers 35 are formed, the continuous bottom spacer 35B between adjacent gate structures is formed.

Figures 11A, 11B, 11C:
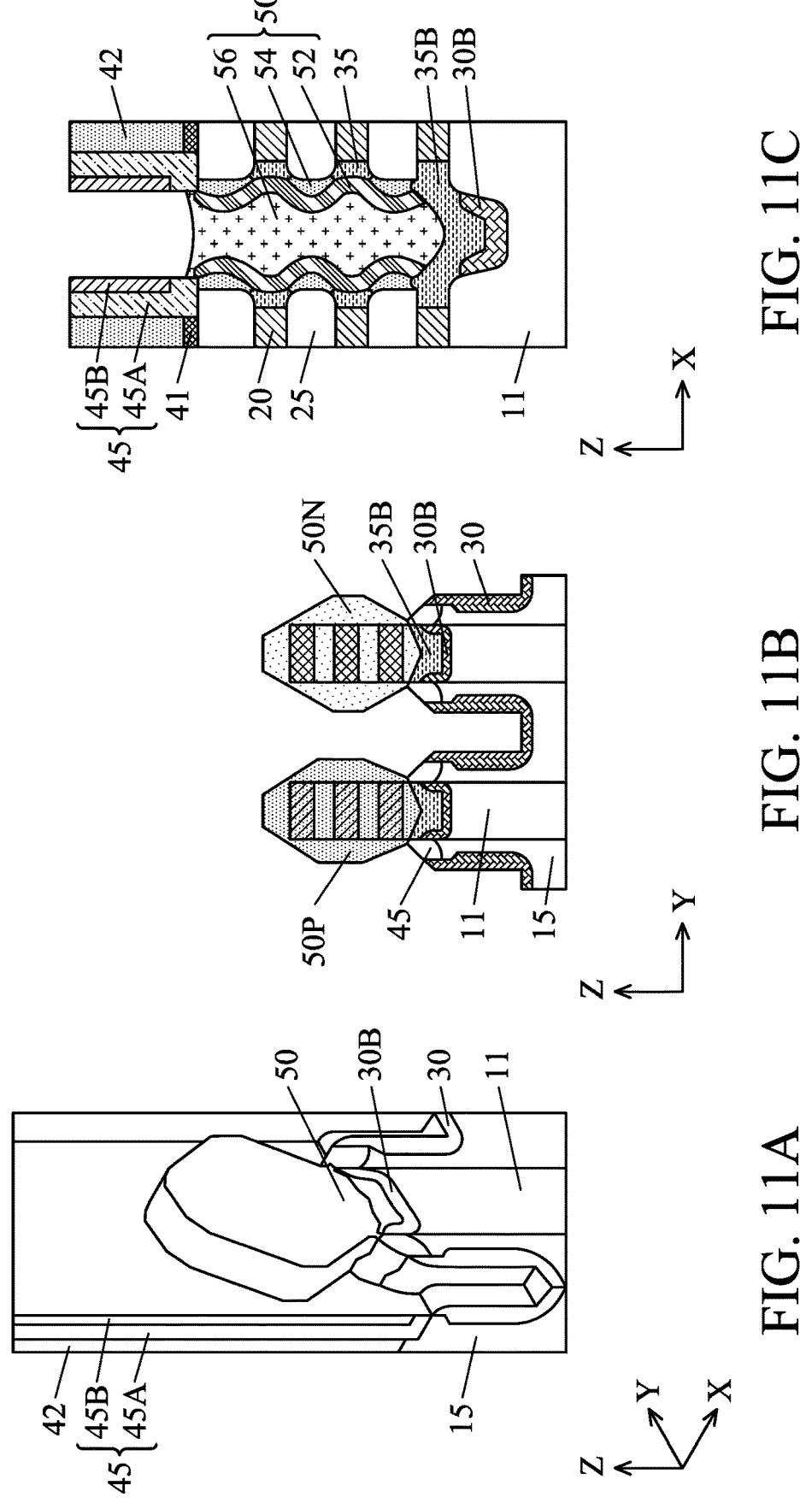
FIGS. 11A, 11B and 11C show one of the various stages of a sequential manufacturing process of a semiconductor GAA FET device according to an embodiment of the present disclosure.

In some embodiments, as shown in FIG. 11C, the bottom spacer 35B fully covers the end face of the bottommost one of the first semiconductor layers 20, and continuously covers the remaining bottom portion 30B of the first insulating layer.

After the inner spacers 35 are formed, one or more source/drain epitaxial layers are formed in the source/drain space 21, as shown in FIGS. 11A-11C. In some embodiments, the source/drain epitaxial layer 50 includes a first epitaxial layer 52 formed on the end faces of the second semiconductor layers 25, a second epitaxial layer 54 formed on the first epitaxial layer 52 and over the inner spacers 35 and a third epitaxial layer 56 formed on the second epitaxial layer 54, fully filling the source/drain space.

In some embodiments, the first epitaxial layer 52 is one or more of SiAs, SiCAs or SiPAs, and the second and third epitaxial layers are one or more of SiP, SiCP or SiC, for an n-type GAA FET. In some embodiments, the first epitaxial layer 52 is one or more of SiB or SiGeB, and the second and third epitaxial layers are one or more of SiGe or SiGeSn, which may contain B, for a p-type GAA FET.

In some embodiments, a thickness (lateral thickness) of the first epitaxial layer 52 on the ends of the second semiconductor layers 25 is in a range from about 2 nm to about 4 nm, and a doping amount of the first epitaxial layer 52 is smaller than doping amounts of the second and third epitaxial layers. In some embodiments, a thickness (lateral thickness) of the second epitaxial layer 54 is in a range from about 2 nm to about 4 nm, and a doping amount of the second epitaxial layer 54 is smaller than a doping amount of the third epitaxial layer. In some embodiments, a thickness of the third epitaxial layer 56 is in a range from about 7 nm to about 30 nm.

FIGS. 12A-15B show various stages after the structure corresponding to FIGS. 11A-11C is formed (epitaxial layer 50 is formed). In FIGS. 12A-15B, the epitaxial layer 50 is illustrated as one layer. Although FIGS. 1-3B and 12A-15B show four second and first semiconductor layers, while FIGS. 4A-11C show three second and first semiconductor layers, the structures and manufacturing operations thereof are substantially the same.

Figure 12A:
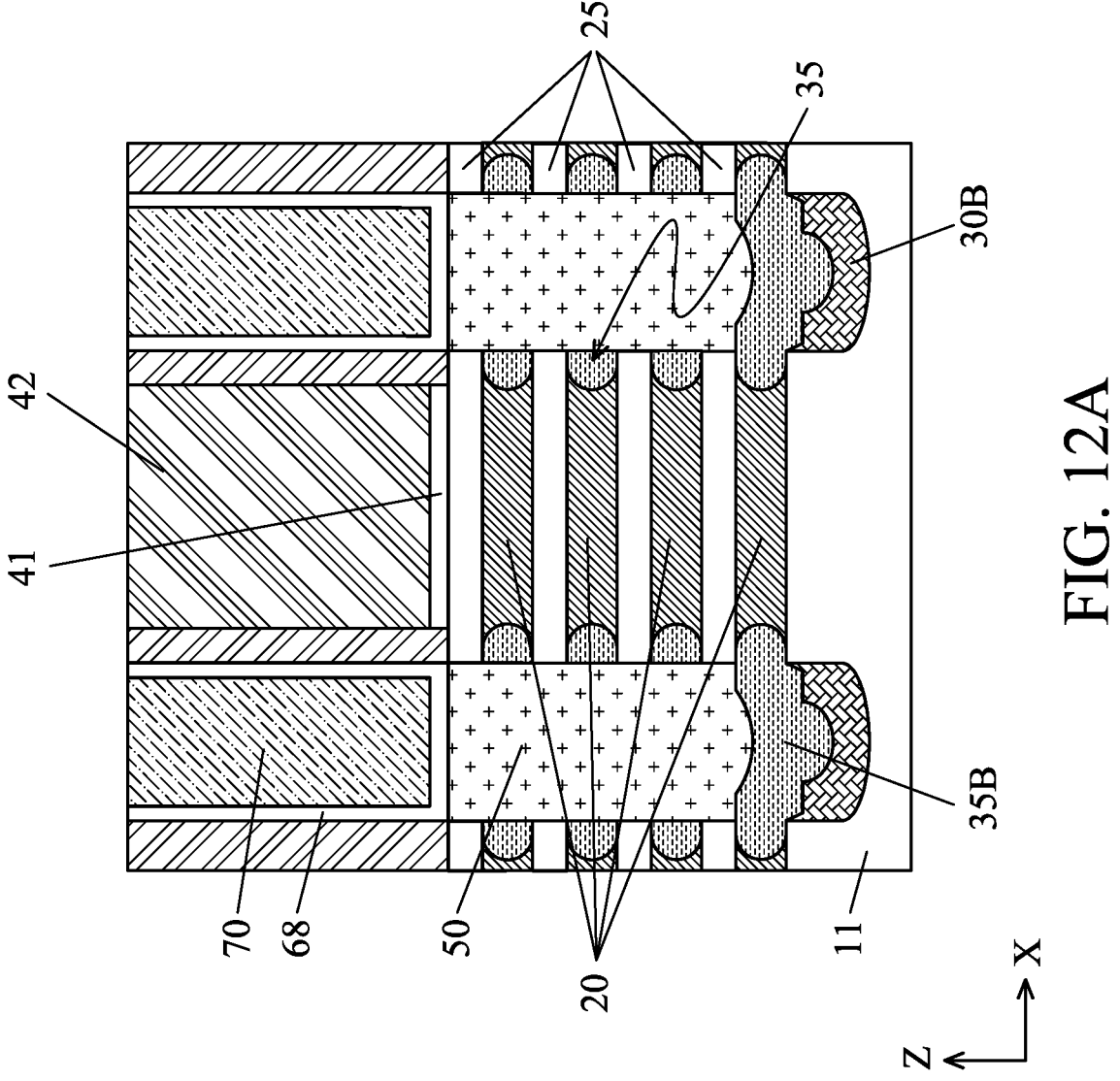
FIGS. 12A, 12B, 13, 14, 15A and 15B show views of the various stages of a sequential manufacturing process of a semiconductor GAA FET device according to an embodiment of the present disclosure.

After the source/drain epitaxial layer 50 is formed, an interlayer dielectric (ILD) layer 70 is formed over the source/drain epitaxial layer 50, the sacrificial gate structure 40, and the sidewall spacers 45. The materials for the ILD layer 70 include compounds comprising Si, 0, C and/or H, such as silicon oxide, SiCOH and SiOC. Organic materials, such as polymers, may be used for the ILD layer 70. In some embodiments, an etch stop layer 68 is formed before the ILD layer 70 is formed. In some embodiments, the etch stop layer 68 includes silicon nitride or SiON. After the ILD layer 70 is formed, one or more planarization operations, such as CMP, are performed, so that the top portion of the sacrificial gate electrode layer 42 is exposed, as shown in FIG. 12A.

Figure 12B:
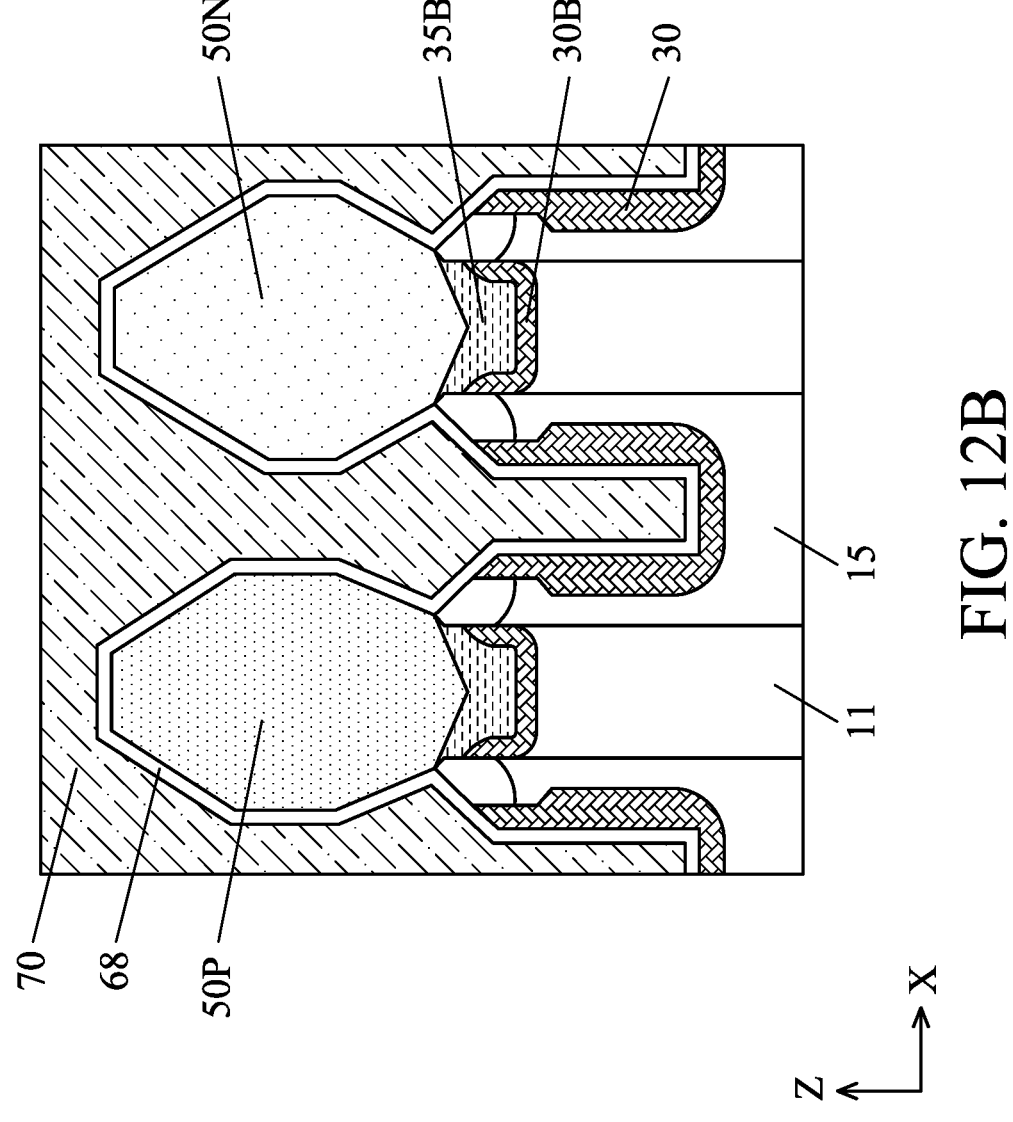

In some embodiments, as shown in FIG. 12B, a part of the ILD layer 70 and the etch stop layer 68 penetrate into the recess formed in the isolation insulating layer 15. In some embodiments, the remaining first insulating layer 30 in the recess is disposed between the ILD layer 70 (and/or the etch stop layer 68) and the isolation insulating layer 15.

Then, the sacrificial gate electrode layer 42 and sacrificial gate dielectric layer 41 are removed. The ILD layer 70 protects the source/drain epitaxial layer 50 during the removal of the sacrificial gate structures 40. The sacrificial gate structures 40 can be removed using plasma dry etching and/or wet etching. When the sacrificial gate electrode layer 42 is polysilicon and the ILD layer 70 is silicon oxide, a wet etchant such as a TMAH solution can be used to selectively remove the sacrificial gate electrode layer 42. The sacrificial gate dielectric layer 41 is thereafter removed using plasma dry etching and/or wet etching.

Figure 13:
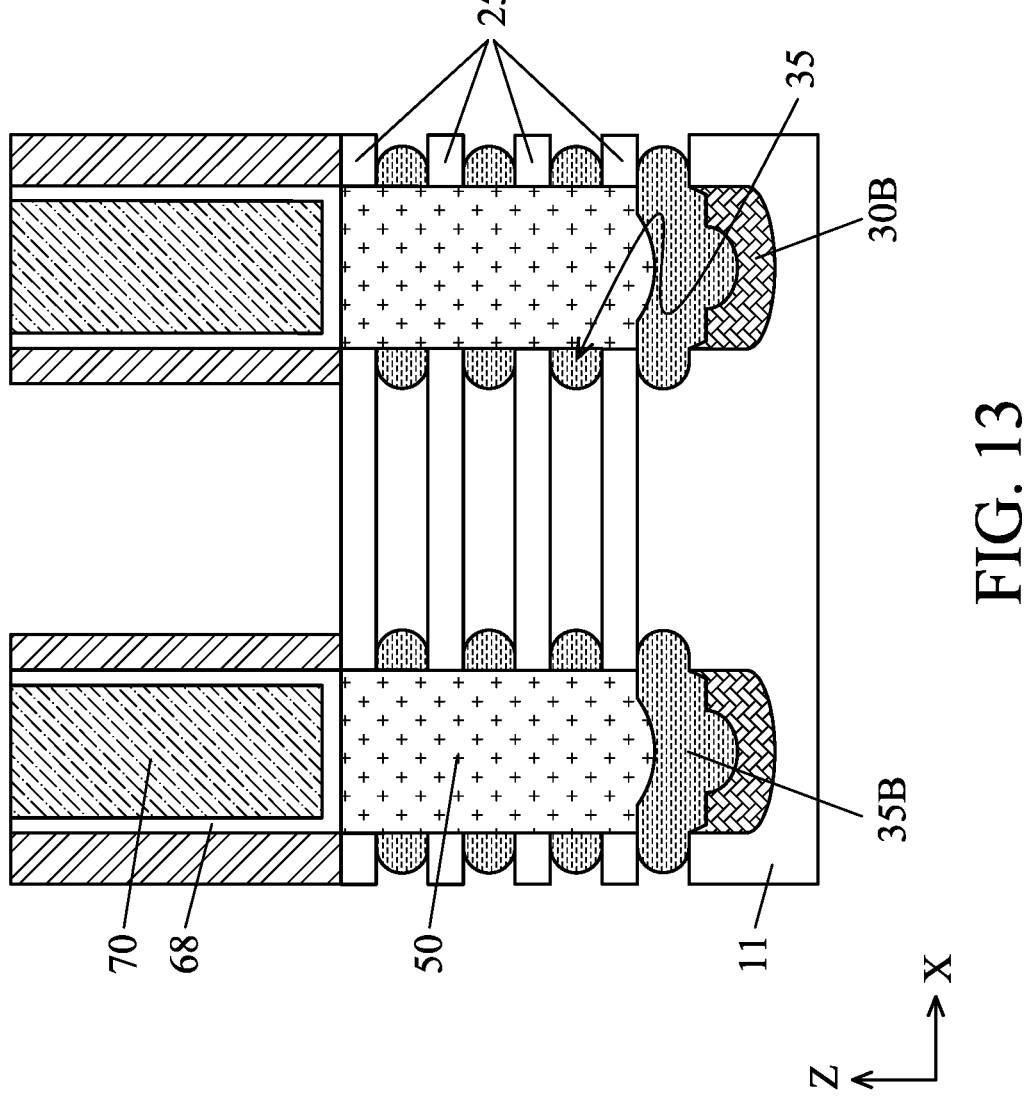

After the sacrificial gate structures are removed, the first semiconductor layers 20 are removed, thereby forming wires or sheets (channel regions) of the second semiconductor layers 25, as shown in FIG. 13. The first semiconductor layers 20 can be removed/etched using an etchant that can selectively etch the first semiconductor layers 20 against the second semiconductor layers 25 and against the inner spacers 35 that act as etch stops.

Figure 14:
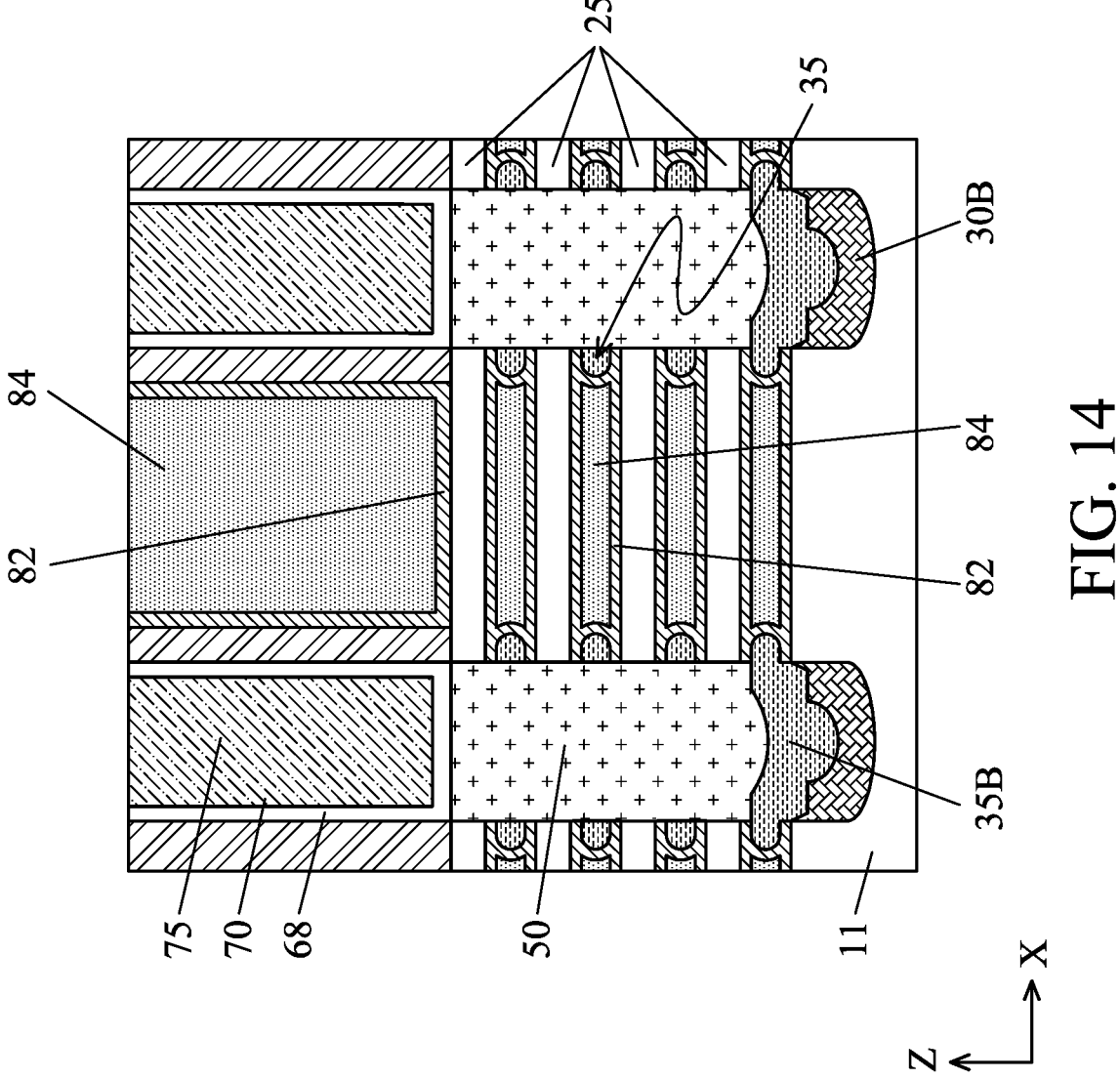

Further, a metal gate structure that includes the gate dielectric layer 82 and the gate electrode layer 84 are formed to wrap around each of the semiconductor sheets or wires 25, as shown in FIG. 14.

In some embodiments, the gate dielectric layer 82 includes a high-k dielectric layer, such as hafnium oxide. In some embodiments, the gate electrode layer 84 includes one or more work function adjustment layers. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers. In some embodiments, a body gate electrode layer including W, Co, Ni, Mo or other suitable material is formed over the work function adjustment material layers.

Figure 15A:
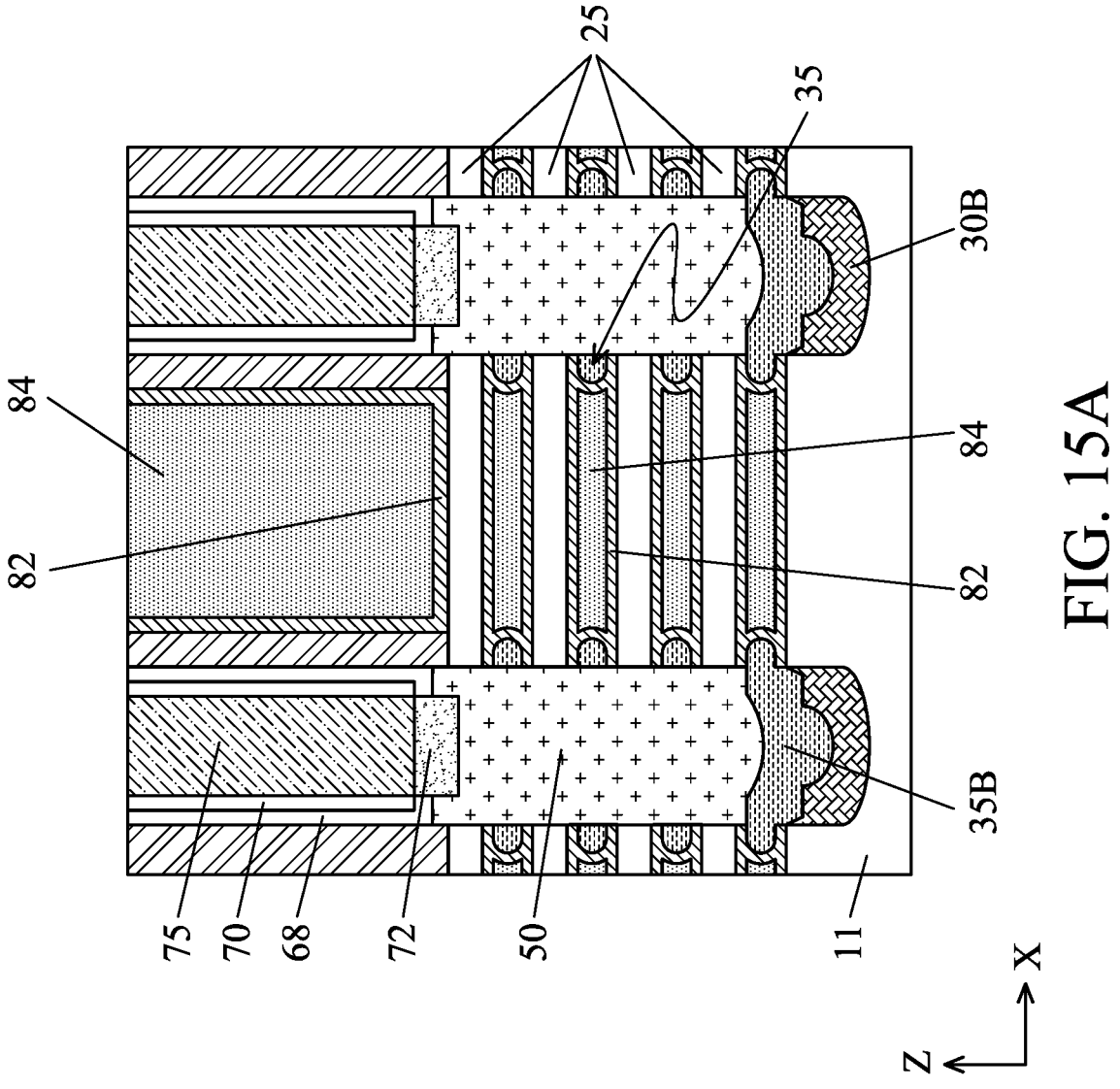
Figure 15B:
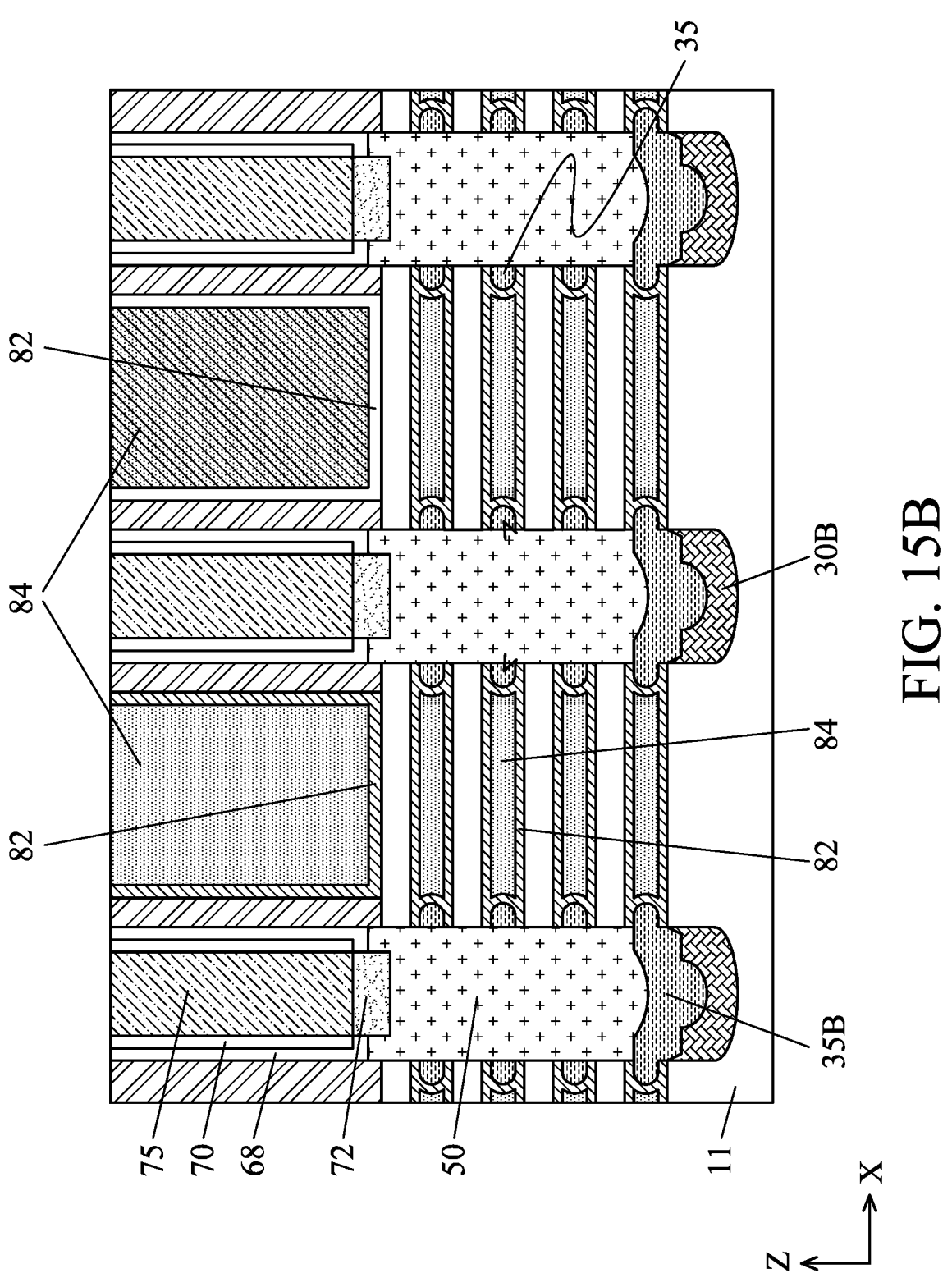

After the metal gate structure is formed, the ILD layer 70 is patterned and a conductive contact layer 72 is formed over the epitaxial layer 50 and a conductive contact plug 75 is formed on the conductive contact layer 72 as shown in FIGS. 15A and 15B. In some embodiments, the conductive contact layer 72 includes one or more of Co, Ni, W, Ti, Ta, Cu, Al, silicide thereof, TiN and TaN. The conductive contact plug 75 includes one or more layers of Co, Ni, W, Ti, Ta, Cu, Al, TiN and TaN.

Although FIGS. 12A-15B show four channel regions 25, the number of the channel regions 25 is not limited to four, and may be one, two, three one or more, and may be up to 10 or 15. By adjusting the number of the semiconductor wires or sheets, a driving current of the GAA FET device can be adjusted.

Figure 16B:
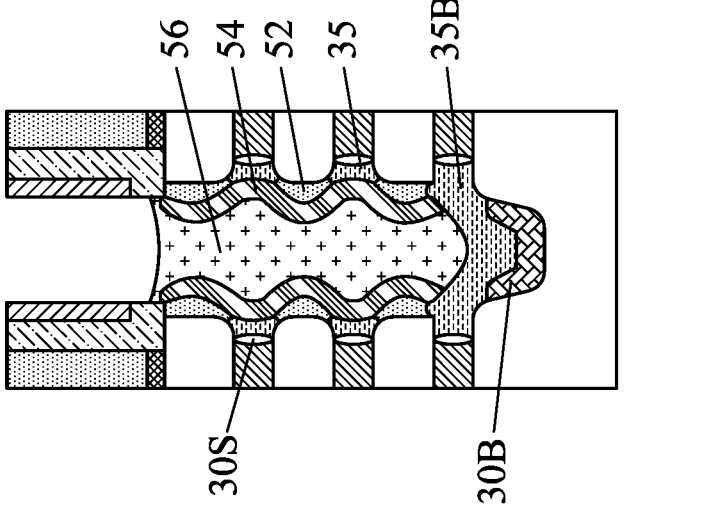
FIGS. 16A and 16B show views of the various stages of a sequential manufacturing process of a semiconductor GAA FET device according to an embodiment of the present disclosure.
Figure 16A:
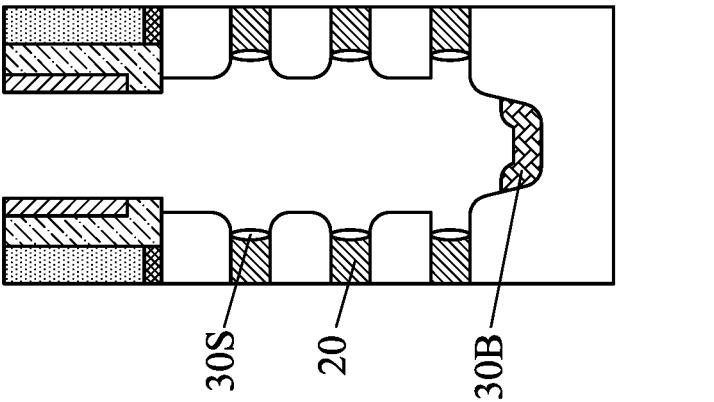

FIGS. 16A and 16B show views of the various stages of a sequential manufacturing process of a semiconductor GAA FET device according to an embodiment of the present disclosure. Materials, configurations, dimensions and/or processes the same as or similar to the foregoing embodiments described with respect to the foregoing embodiments may be employed in the following embodiments, and detailed explanation thereof may be omitted.

In the etching operation as explained with respect to FIGS. 8A-8C, a part of the first insulating layer 30S remains on the ends of the first semiconductor layer 20 as shown in FIG. 16A and the inner spacers 35 are formed over the remaining first insulating layer 30S as shown in FIG. 16B. In some embodiments, the thickness (lateral direction) of the remaining first insulating layer 30S is in a range from about 0.1 nm to about 3 nm. In some embodiments, the dielectric constant of the remaining insulating layer 30S is smaller than the dielectric constant of the inner spacers 35, and thus by using the two layer structure, it is possible to reduce parasitic capacitance.

FIGS. 17A and 17B to FIGS. 20A and 20B show views of the various stages of a sequential manufacturing process of a semiconductor GAA FET device according to an embodiment of the present disclosure. Materials, configurations, dimensions and/or processes the same as or similar to the foregoing embodiments described with respect to the foregoing embodiments may be employed in the following embodiments, and detailed explanation thereof may be omitted.

In some embodiments, the bottom portion 30B of the first insulating layer has a curved upper surface convex upwardly as shown in FIGS. 17A and 17B. In some embodiments, the top of the bottom portion 30B of the first insulating layer is lower than the bottom surface of the bottommost one of the first semiconductor layer 20. In some embodiments, after the inner spacers 35 and the bottom spacer 35B are formed, the bottom spacer 35B is discontinuous and a part of the upper surface of the bottom portion 30B of the first insulating layer is exposed as shown in FIG. 17B.

In some embodiments, the bottom portion 30B of the first insulating layer has a curved upper surface convex upwardly, and the top of the bottom portion 30B of the first insulating layer is equal to or higher than the bottom surface of the bottommost one of the first semiconductor layer 20 as shown in FIGS. 18A and 18B. In some embodiments, after the inner spacers 35 and the bottom spacer 35B are formed, the bottom spacer 35B is discontinuous and a part of the upper surface of the bottom portion 30B of the first insulating layer is exposed as shown in FIG. 18B.

In some embodiments, the bottom portion 30B of the first insulating layer has a flat surface as shown in FIGS. 19A and 19B. In some embodiments, the top of the bottom portion 30B of the first insulating layer is lower than the bottom surface of the bottommost one of the first semiconductor layer 20. In some embodiments, after the inner spacers 35 and the bottom spacer 35B are formed, the bottom spacer 35B is discontinuous and a part of the upper surface of the bottom portion 30B of the first insulating layer is exposed as shown in FIG. 19B.

In some embodiments, the bottom portion 30B of the first insulating layer has a flat surface, and the top of the bottom portion 30B of the first insulating layer is equal to or higher than the bottom surface of the bottommost one of the first semiconductor layer 20 as shown in FIGS. 20A and 20B. In some embodiments, after the inner spacers 35 and the bottom spacer 35B are formed, the bottom spacer 35B is discontinuous and a part of the upper surface of the bottom portion 30B of the first insulating layer is exposed as shown in FIG. 20B.

In other embodiments, the bottom spacer 35B is continuous and no part of the upper surface of the bottom portion 30B of the first insulating layer is exposed in the structures shown in FIGS. 17B, 18B, 19B and 20B

FIGS. 21A-21E show views of the various stages of a sequential manufacturing process of a semiconductor GAA FET device according to an embodiment of the present disclosure. Materials, configurations, dimensions and/or processes the same as or similar to the foregoing embodiments described with respect to the foregoing embodiments may be employed in the following embodiments, and detailed explanation thereof may be omitted.

Figure 21C:
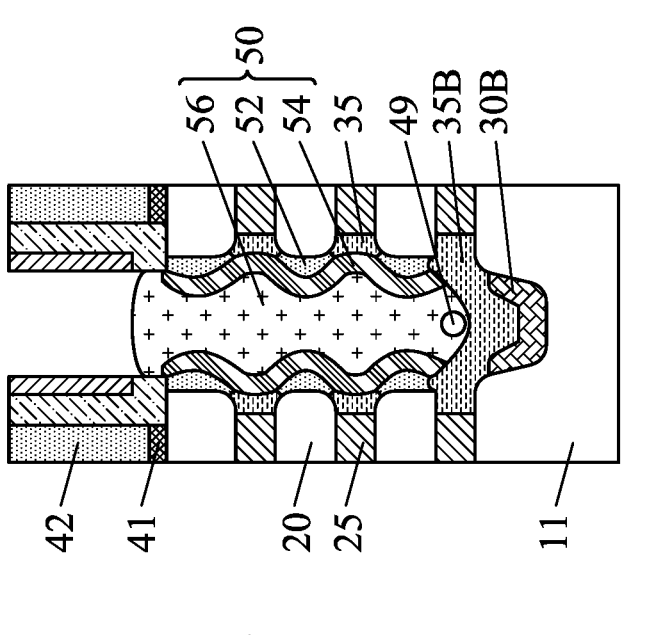
FIGS. 21A, 21B, 21C, 21D and 21E show views of the various stages of a sequential manufacturing process of a semiconductor GAA FET device according to an embodiment of the present disclosure.
Figure 21B:
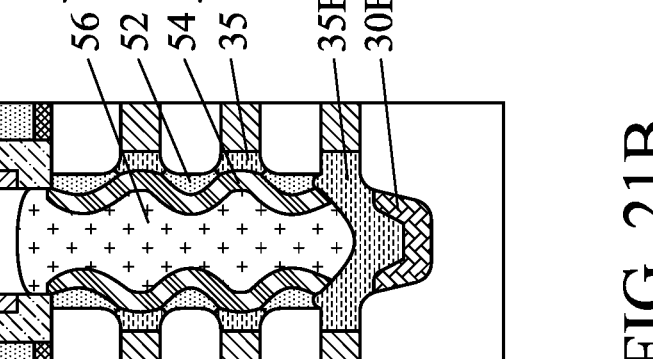
Figure 21A:
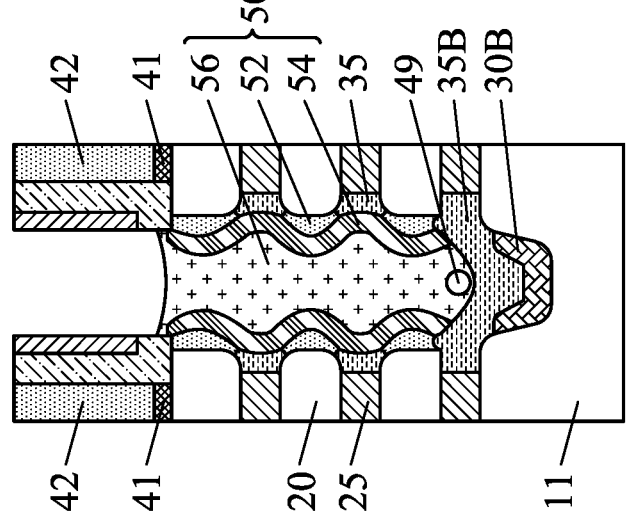
Figures 21D, 21E:
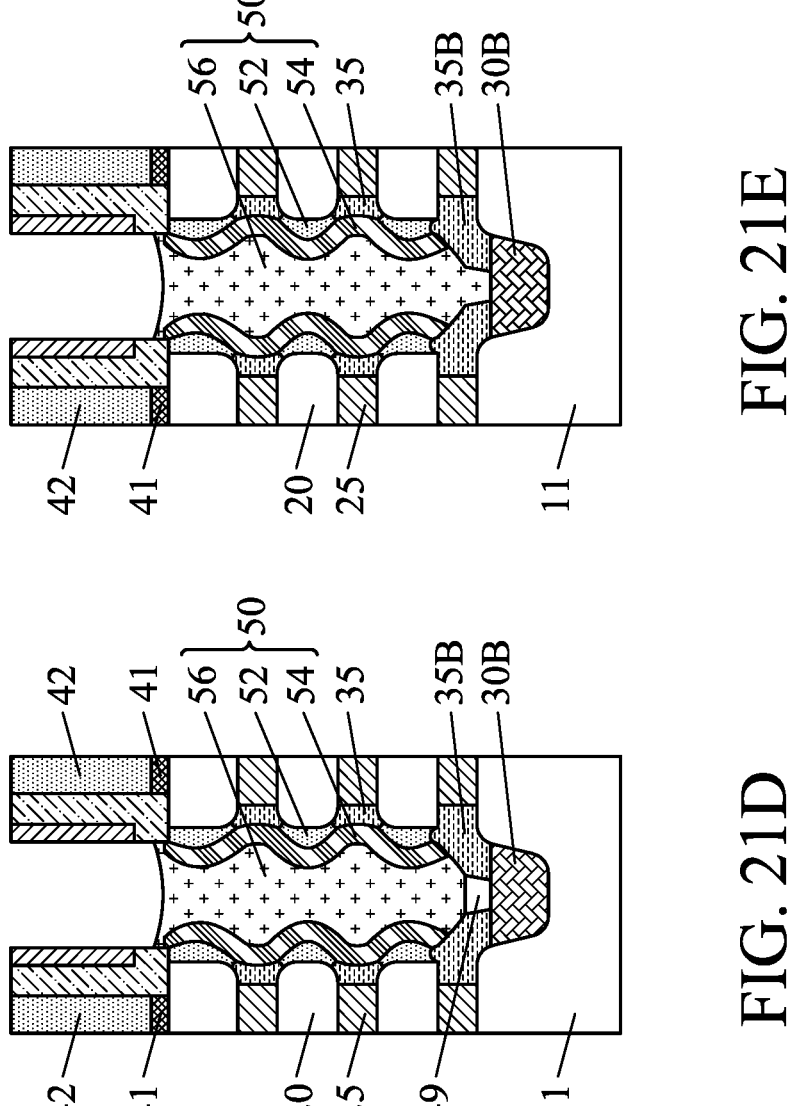

In some embodiments, an air gap or a void 49 is formed at the bottom of the source/drain epitaxial layer 50, which can also suppress an off-current of the GAA FETs, as shown in FIGS. 21A and 21C. In some embodiments, the air gap passes through the bottom spacer 35B as shown in FIG. 21D, when the structures of FIGS. 17A-20B are employed.

In some embodiments, the upper surface of the third epitaxial layer 56 has a curved upper surface convex upwardly, as shown in FIGS. 21B and 21C. In some embodiments, a part of the epitaxial layer 50 penetrates and separates the bottom spacer 35B as shown in FIG. 21E, when the structures of FIGS. 17A-20B are employed.

In the foregoing embodiments, two layers of bottom spacers are formed at the bottom of the source/drain epitaxial layer, which can suppress a junction leakage current and/or an off-current.

It will be understood that not all advantages have been necessarily discussed herein, no particular advantage is required for all embodiments or examples, and other embodiments or examples may offer different advantages.

According to some embodiments of the present disclosure, in a method of manufacturing a semiconductor device, a fin structure, in which first semiconductor layers and second semiconductor layers are alternately stacked over a substrate, is formed, a sacrificial gate structure is formed over the fin structure, a source/drain region of the fin structure, which is not covered by the sacrificial gate structure, is etched thereby forming a source/drain space, ends of the first semiconductor layers are laterally etched in the source/drain space, a first insulating layer is formed on a sidewall of the source/drain space, the first insulating layer is partially etched, thereby forming a first bottom spacer at a bottom of the source/drain space, a second insulating layer is formed on the sidewall of the source/drain space, the second insulating layer is partially etched, thereby forming inner spacers on end faces of the first semiconductor layers and leaving a part of the second insulating layer as a second bottom spacer at the bottom of the source/drain space, and a source/drain epitaxial layer is formed in the source/drain space. In one or more of the foregoing or following embodiments, the second bottom spacer at least partially covers the first bottom spacer. In one or more of the foregoing or following embodiments, the second bottom spacer fully covers the first bottom spacer. In one or more of the foregoing or following embodiments, an air gap is formed between the source/drain epitaxial layer and the second bottom spacer. In one or more of the foregoing or following embodiments, one of the inner spacers formed on an end face of a bottommost one of the first semiconductor layer and the second bottom spacer are continuous. In one or more of the foregoing or following embodiments, the first insulating layer has a lower dielectric constant than the second insulating layer. In one or more of the foregoing or following embodiments, the first insulating layer includes SiOCN. In one or more of the foregoing or following embodiments, first insulating layer is made of $SiO_xC_yN_z$, where $0.1 \leq x \leq 0.4$, $0.05 \leq y \leq 0.1$ and $0.2 \leq z \leq 0.5$. In one or more of the foregoing or following embodiments, the first insulating layer includes a first portion and a second portion having a higher etching resistance against a dilute HF solution.

In accordance with another aspect of the present disclosure, in a method of manufacturing a semiconductor device, a fin structure, in which first semiconductor layers and second semiconductor layers are alternately stacked over a substrate, is formed, sacrificial gate structures are formed over the fin structure, a source/drain region of the fin structure, which is disposed between the sacrificial gate structures, is etched thereby forming a source/drain space, ends of the first semiconductor layers are laterally etched in the source/drain space, a first insulating layer is formed on a sidewall of the source/drain space, the first insulating layer is partially etched, thereby forming first inner spacers on end faces of the first semiconductor layers and leaving a part of the first insulating layer as a first bottom spacer at a bottom of the source/drain space, a second insulating layer is formed on the sidewall of the source/drain space, the second insulating layer is partially etched, thereby forming second inner spacers on the first inner spacers, respectively and leaving a part of the second insulating layer as a second bottom spacer at the bottom of the source/drain space, and a source/drain epitaxial layer is formed in the source/drain space. In one or more of the foregoing or following embodiments, the first insulating layer is partially etched by using a wet etching operation. In one or more of the foregoing or following embodiments, the first insulating layer is formed by a plasma deposition method with varying a power during deposition. In one or more of the foregoing or following embodiments, the power is in a range from 20 W to 100 W. In one or more of the foregoing or following embodiments, the second bottom spacer partially covers the first bottom spacer. In one or more of the foregoing or following embodiments, the source/drain epitaxial layer contacts the first bottom spacer. In one or more of the foregoing or following embodiments, an air gap is formed between the source/drain epitaxial layer and the first and second bottom spacers.

In accordance with another aspect of the present disclosure, in a method of manufacturing a semiconductor device, a fin structure in which first semiconductor layers and second semiconductor layers are alternately stacked over a substrate is formed. An upper portion of the fin structure protrudes from an isolation insulating layer. A sacrificial gate structure is formed over the fin structure, a source/drain region of the fin structure, which is not covered by the sacrificial gate structure, is etched thereby forming a source/drain space, ends of the first semiconductor layers are laterally etched in the source/drain space, a first insulating layer is formed on a sidewall of the source/drain space, the first insulating layer is partially etched thereby forming a first bottom spacer at a bottom of the source/drain space, a second insulating layer is formed on the sidewall of the source/drain space, the second insulating layer is partially etched, thereby forming inner spacers and leaving a part of the second insulating layer as a second bottom spacer at the bottom of the source/drain space, a source/drain epitaxial layer is formed in the source/drain space, and an interlayer dielectric (ILD) layer is formed over the source/drain epitaxial layer. In one or more of the foregoing or following embodiments, during the etching of the source/drain region, a part of the isolation insulating layer is etched thereby forming a recess. In one or more of the foregoing or following embodiments, the first insulating layer is formed on an inner sidewall of the recess, a part of which remains after the first insulating layer is partially etched. In one or more of the foregoing or following embodiments, the ILD layer is formed over the remaining first insulating layer in the recess.

In accordance with another aspect of the present disclosure, a semiconductor device includes semiconductor sheets or wires disposed over and vertically arranged over a bottom fin structure disposed over a substrate, a gate structure, a source/drain epitaxial layer, and a first bottom spacer and a second bottom spacer disposed between the bottom fin structure and the source/drain epitaxial layer. The second bottom spacer is disposed between the first bottom spacer and the source/drain epitaxial layer and made of a different insulating material than the first bottom spacer. In one or more of the foregoing or following embodiments, the semiconductor device further includes inner spacers disposed between the gate structure and the source/drain epitaxial layer. The inner spacers are made of a same material as the second bottom spacer. In one or more of the foregoing or following embodiments, the second bottom spacer and a bottommost one of the inner spacers are continuous. In one or more of the foregoing or following embodiments, the semiconductor device further comprises an air gap is disposed below the source/drain epitaxial layer. In one or more of the foregoing or following embodiments, the first bottom spacer includes SiOCN. In one or more of the foregoing or following embodiments, the first bottom spacer is made of $SiO_xC_yN_z$, where $0.1 \leq x \leq 0.4$, $0.05 \leq y \leq 0.1$ and $0.2 \leq z \leq 0.5$. In one or more of the foregoing or following embodiments, the second bottom spacer includes silicon nitride. In one or more of the foregoing or following embodiments, a top of the first bottom spacer is located below a top of the bottom fin structure. In one or more of the foregoing or following embodiments, a top of the first bottom spacer is located above a top of the bottom fin structure.

In accordance with another aspect of the present disclosure, a semiconductor device includes first group of semiconductor sheets or wires disposed over and vertically arranged over a bottom fin structure disposed over a substrate, second group of semiconductor sheets or wires disposed over and vertically arranged over the bottom fin structure, a first gate structure over the first group of semiconductor sheets or wires, a second gate structure over the second group of semiconductor sheets or wires, a source/drain epitaxial layer between the first group of semiconductor sheets or wires and the second group of semiconductor sheets or wires, first inner spacers disposed between the first gate structure and the source/drain epitaxial layer, second inner spacers disposed between the second gate structure and the source/drain epitaxial layer, and a first bottom spacer and a second bottom spacer disposed between the bottom fin structure and the source/drain epitaxial layer. The second bottom spacer is disposed between the first bottom spacer and the source/drain epitaxial layer and made of a different insulating material than the first bottom spacer, and a bottommost one of the first inner spacers, the second bottom spacer a bottom one of the second inner spacers are continuous. In one or more of the foregoing or following embodiments, a semiconductor device further includes an air gap is disposed below the source/drain epitaxial layer. In one or more of the foregoing or following embodiments, the first bottom spacer includes SiOCN. In one or more of the foregoing or following embodiments, first bottom spacer is made of $SiO_xC_yN_z$, where $0.1 \leq x \leq 0.4$, $0.05 \leq y \leq 0.1$ and $0.2 \leq z \leq 0.5$. In one or more of the foregoing or following embodiments, the second bottom spacer includes silicon nitride. In one or more of the foregoing or following embodiments, a top of the first bottom spacer is located below a top of the bottom fin structure. In one or more of the foregoing or following embodiments, a top of the first bottom spacer is located above a top of the bottom fin structure.

In accordance with another aspect of the present disclosure, a semiconductor device includes a first group of semiconductor sheets or wires disposed over and vertically arranged over a bottom fin structure disposed over a substrate, a second group of semiconductor sheets or wires disposed over and vertically arranged over the bottom fin structure, an isolation insulating layer disposed over the substrate, a first gate structure over the first group of semiconductor sheets or wires, a second gate structure over the second group of semiconductor sheets or wires, a source/drain epitaxial layer between the first group of semiconductor sheets or wires and the second group of semiconductor sheets or wires, first inner spacers disposed between the first gate structure and the source/drain epitaxial layer, second inner spacers disposed between the second gate structure and the source/drain epitaxial layer, a first bottom spacer and a second bottom spacer disposed between the bottom fin structure and the source/drain epitaxial layer, and an interlayer dielectric (ILD) layer. The second bottom spacer is disposed between the first bottom spacer and the source/drain epitaxial layer and made of a different insulating material than the first bottom spacer, the isolation insulating layer includes a recessed portion, and an insulating layer made of a same material as the first bottom spacer is disposed between the ILD layer and the isolation insulating layer in the recessed portion. In one or more of the foregoing or following embodiments, a bottommost one of the first inner spacers and a bottom one of the second inner spacers are separated. In one or more of the foregoing or following embodiments, a bottommost one of the first inner spacers and a bottom one of the second inner spacers are separated by the epitaxial layer. In one or more of the foregoing or following embodiments, a bottommost one of the first inner spacers and a bottom one of the second inner spacers are separated by an air gap.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:

forming a fin structure in which first semiconductor layers and second semiconductor layers are alternately stacked over a substrate;

forming a sacrificial gate structure over the fin structure;

etching a source/drain region of the fin structure, which is not covered by the sacrificial gate structure, thereby forming a source/drain space;

laterally etching ends of the first semiconductor layers in the source/drain space;

forming a first insulating layer on a sidewall of the source/drain space;

partially etching the first insulating layer, thereby forming a first bottom spacer at a bottom of the source/drain space;

forming a second insulating layer on the sidewall of the source/drain space;

partially etching the second insulating layer, thereby forming inner spacers on end faces of the first semiconductor layers and leaving a part of the second insulating layer as a second bottom spacer at the bottom of the source/drain space; and forming a source/drain epitaxial layer in the source/drain space.

2. The method of claim 1, wherein the second bottom spacer at least partially covers the first bottom spacer.

3. The method of claim 1, wherein the second bottom spacer fully covers the first bottom spacer.

4. The method of claim 1, wherein an air gap is formed between the source/drain epitaxial layer and the second bottom spacer.

5. The method of claim 1, wherein one of the inner spacers formed on an end face of a bottommost one of the first semiconductor layer and the second bottom spacer is continuous.

6. The method of claim 1, wherein the first insulating layer has a lower dielectric constant than the second insulating layer.

7. The method of claim 1, wherein the first insulating layer includes SiOCN.

8. The method of claim 7, wherein first insulating layer is made of $SiO_xC_yN_z$, where $0.1 \leq x \leq 0.4$, $0.05 \leq y \leq 0.1$ and $0.2 \leq z \leq 0.5$.

9. The method of claim 7, wherein the first insulating layer includes a first portion and a second portion having a higher etching resistance against a dilute HF solution.

10. A method of manufacturing a semiconductor device, comprising:

forming a fin structure, in which first semiconductor layers and second semiconductor layers are alternately stacked over a substrate;

forming sacrificial gate structures over the fin structure;

etching a source/drain region of the fin structure, which is disposed between the sacrificial gate structures, thereby forming a source/drain space;

laterally etching ends of the first semiconductor layers in the source/drain space;

forming a first insulating layer on a sidewall of the source/drain space;

partially etching the first insulating layer, thereby leaving a part of the first insulating layer as a first bottom spacer at a bottom of the source/drain space;

forming a second insulating layer on the sidewall of the source/drain space;

partially etching the second insulating layer, thereby forming inner spacers on end faces of the first semiconductor layers and leaving a part of the second insulating layer as a second bottom spacer at the bottom of the source/drain space; and forming a source/drain epitaxial layer in the source/drain space.

11. The method of claim 10, wherein the first insulating layer is partially etched using a wet etching operation.

12. The method of claim 10, wherein the first insulating layer is formed by a plasma deposition method while varying a power during the deposition.

13. The method of claim 12, wherein the power is in a range from 20 W to 100 W.

14. The method of claim 10, wherein the second bottom spacer partially covers the first bottom spacer.

15. The method of claim 14, wherein the source/drain epitaxial layer contacts the first bottom spacer.

16. The method of claim 14, wherein an air gap is formed between the source/drain epitaxial layer and the first and second bottom spacers.

17. A method of manufacturing a semiconductor device, comprising:

forming a fin structure in which first semiconductor layers and second semiconductor layers are alternately stacked over a substrate, and an upper portion of the fin structure protrudes from an isolation insulating layer;

forming a sacrificial gate structure over the fin structure;

etching a source/drain region of the fin structure, which is not covered by the sacrificial gate structure, thereby forming a source/drain space;

laterally etching ends of the first semiconductor layers in the source/drain space;

forming a first insulating layer on a sidewall of the source/drain space;

partially etching the first insulating layer, thereby forming a first bottom spacer at a bottom of the source/drain space;

forming a second insulating layer on the sidewall of the source/drain space;

partially etching the second insulating layer, thereby forming inner spacers and leaving a part of the second insulating layer as a second bottom spacer at the bottom of the source/drain space;

forming a source/drain epitaxial layer in the source/drain space; and forming an interlayer dielectric (ILD) layer over the source/drain epitaxial layer.

18. The method of claim 17, wherein during the etching of the source/drain region, a part of the isolation insulating layer is etched thereby forming a recess.

19. The method of claim 18, wherein the first insulating layer is formed on an inner sidewall of the recess, a part of which remains after the first insulating layer is partially etched.

20. The method of claim 19, wherein the ILD layer is formed over a remaining first insulating layer in the recess.

* * * * *